(12) United States Patent
Matsukawa et al.

(10) Patent No.: US 8,445,837 B2
(45) Date of Patent: May 21, 2013

(54) VIBRATION ACTUATOR FOR ROTATING A ROTATING AXLE AND IMAGE CAPTURING APPARATUS

(75) Inventors: Eiji Matsukawa, Yotsukaido (JP); Kazuyasu Oone, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/801,401

(22) Filed: Jun. 7, 2010

(65) Prior Publication Data

US 2011/0017906 A1    Jan. 27, 2011

Related U.S. Application Data

(63) Continuation of application No. PCT/JP2008/003636, filed on Dec. 5, 2008.

(30) Foreign Application Priority Data

Dec. 7, 2007   (JP) .................................. 2007-317736
Jan. 24, 2008   (JP) .................................. 2008-014158

(51) Int. Cl.
*H01J 5/02*     (2006.01)
*H02N 2/00*    (2006.01)

(52) U.S. Cl.
USPC ..................................... 250/239; 310/323.01

(58) Field of Classification Search
USPC ............ 250/239, 208.1, 214 R, 214.1, 231.1, 250/201.2, 201.4; 310/328, 311, 333, 367–371, 310/36–37, 40 R, 323.01, 323.03; 348/345, 348/357; 359/811, 822–824, 813, 814; 396/133, 396/248

See application file for complete search history.

(56) References Cited

U.S. PATENT DOCUMENTS

| | | | |
|---|---|---|---|
| 5,189,331 A | * | 2/1993 | Mukohjima et al. ...... 310/323.08 |
| 2006/0049720 A1 | * | 3/2006 | Henderson et al. ........... 310/328 |
| 2007/0138915 A1 | * | 6/2007 | Mulvihill et al. ............. 310/328 |

* cited by examiner

*Primary Examiner* — Que T Le
*Assistant Examiner* — Jennifer Bennett

(57) ABSTRACT

Provided is a vibration actuator comprising a drive unit that generates a drive force; a vibrating component that vibrates according to the drive force from the drive unit; a rotating body that receives the vibration of the vibrating component to rotate; and a converting section that changes a contact force between the vibrating component and the rotating body according to size of a load acting on the rotating body.

28 Claims, 28 Drawing Sheets

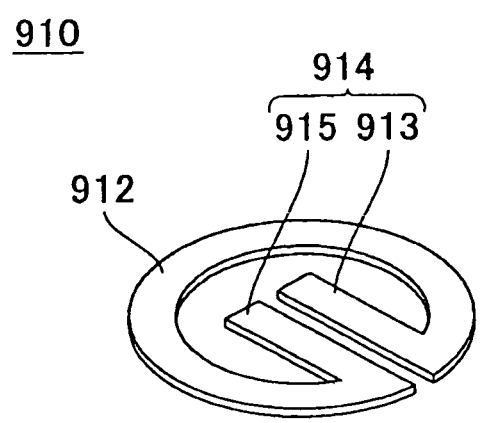
F I G . 9

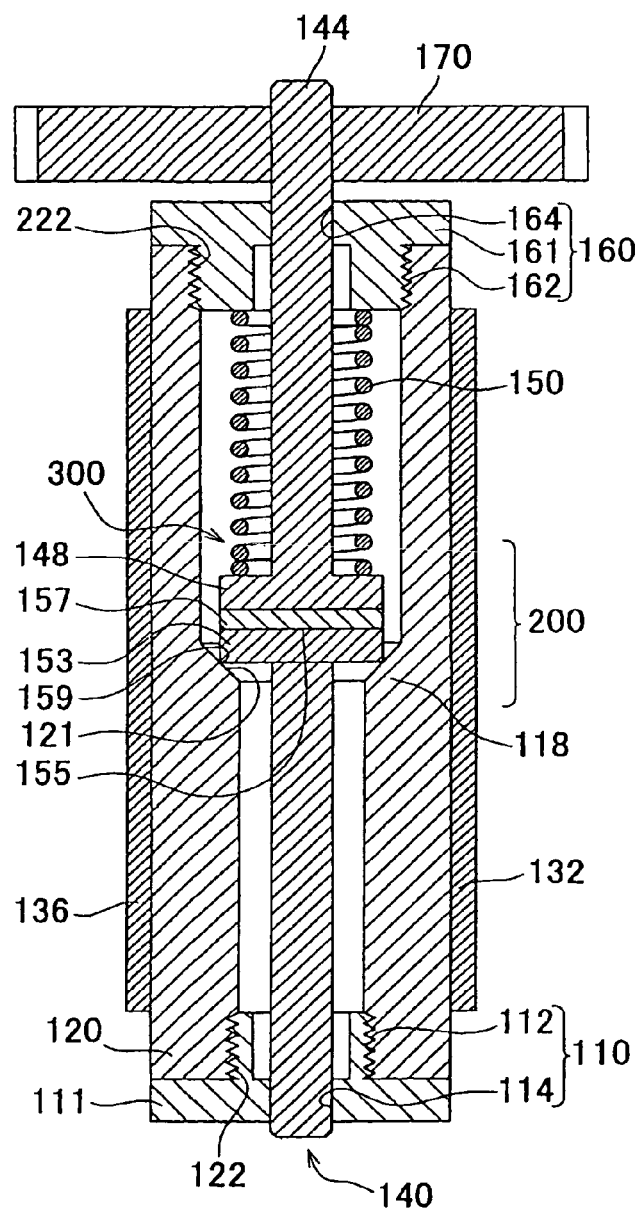
F I G. 12

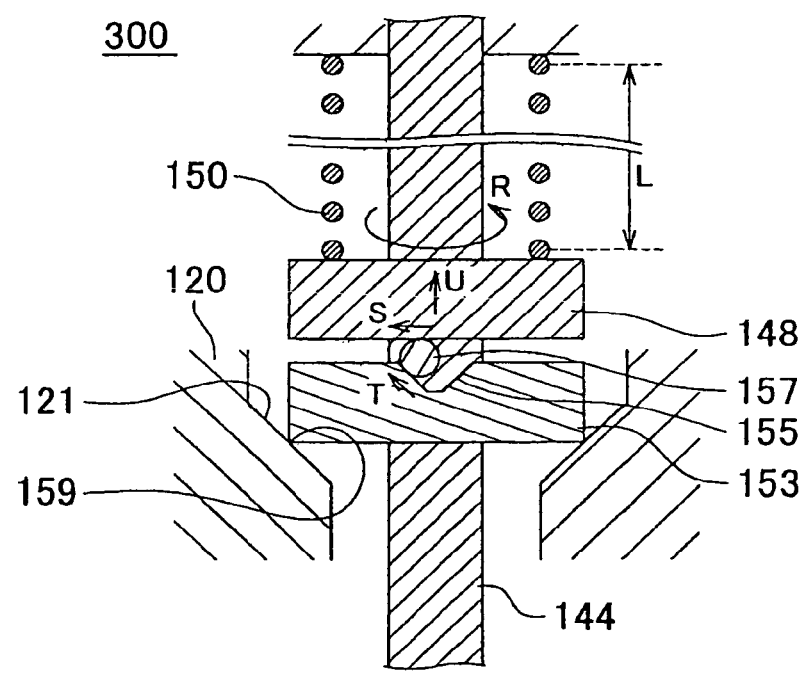
F I G . 14

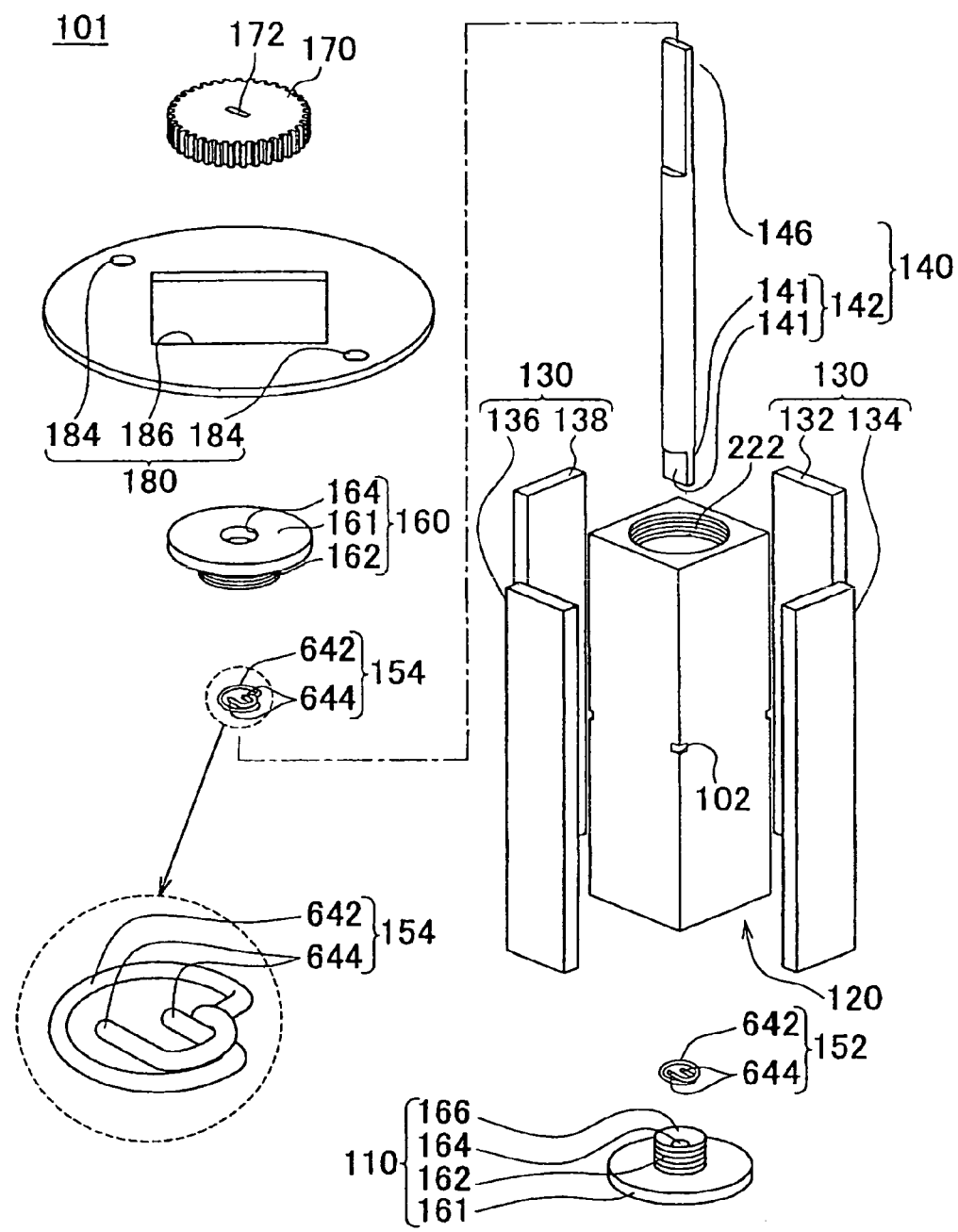
F I G . 15

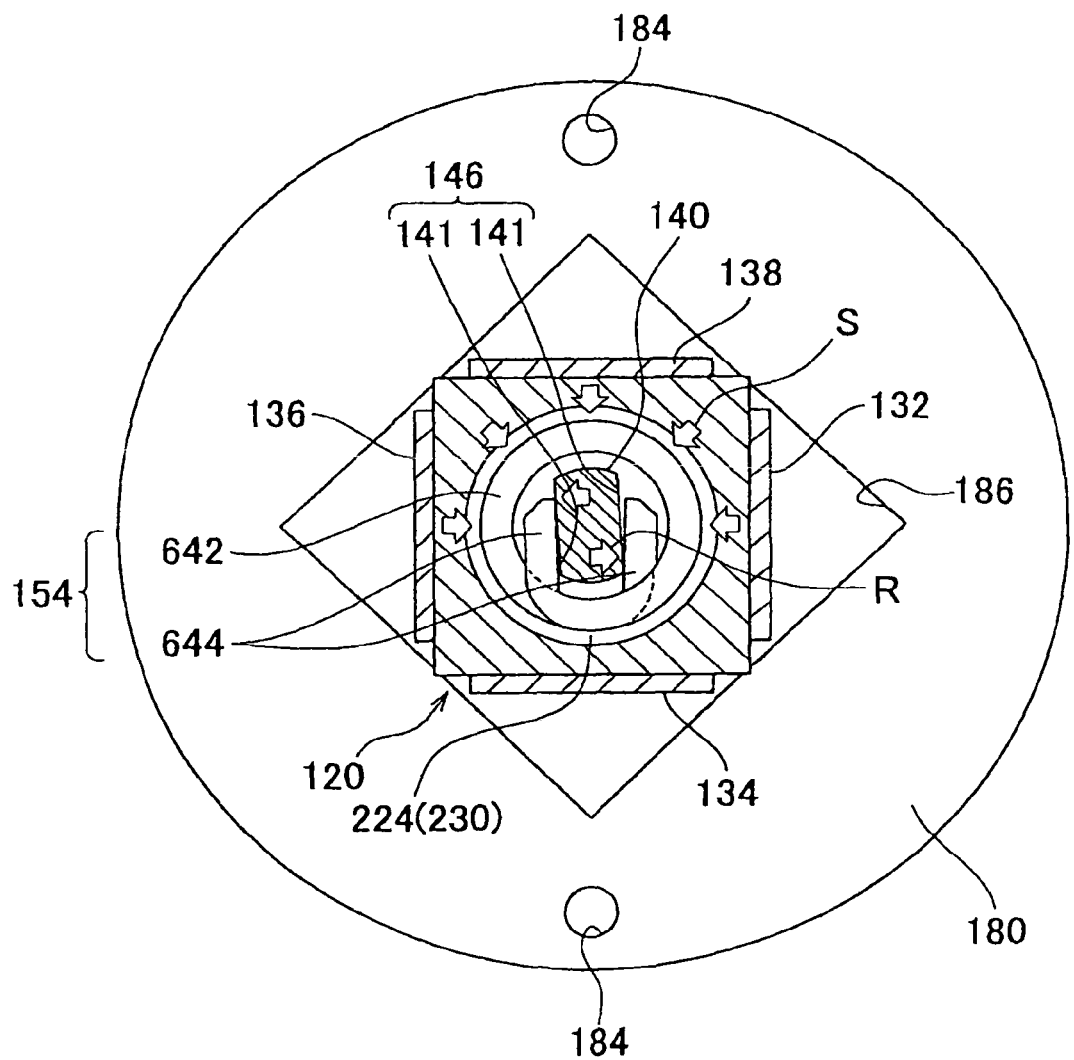
F I G . 20

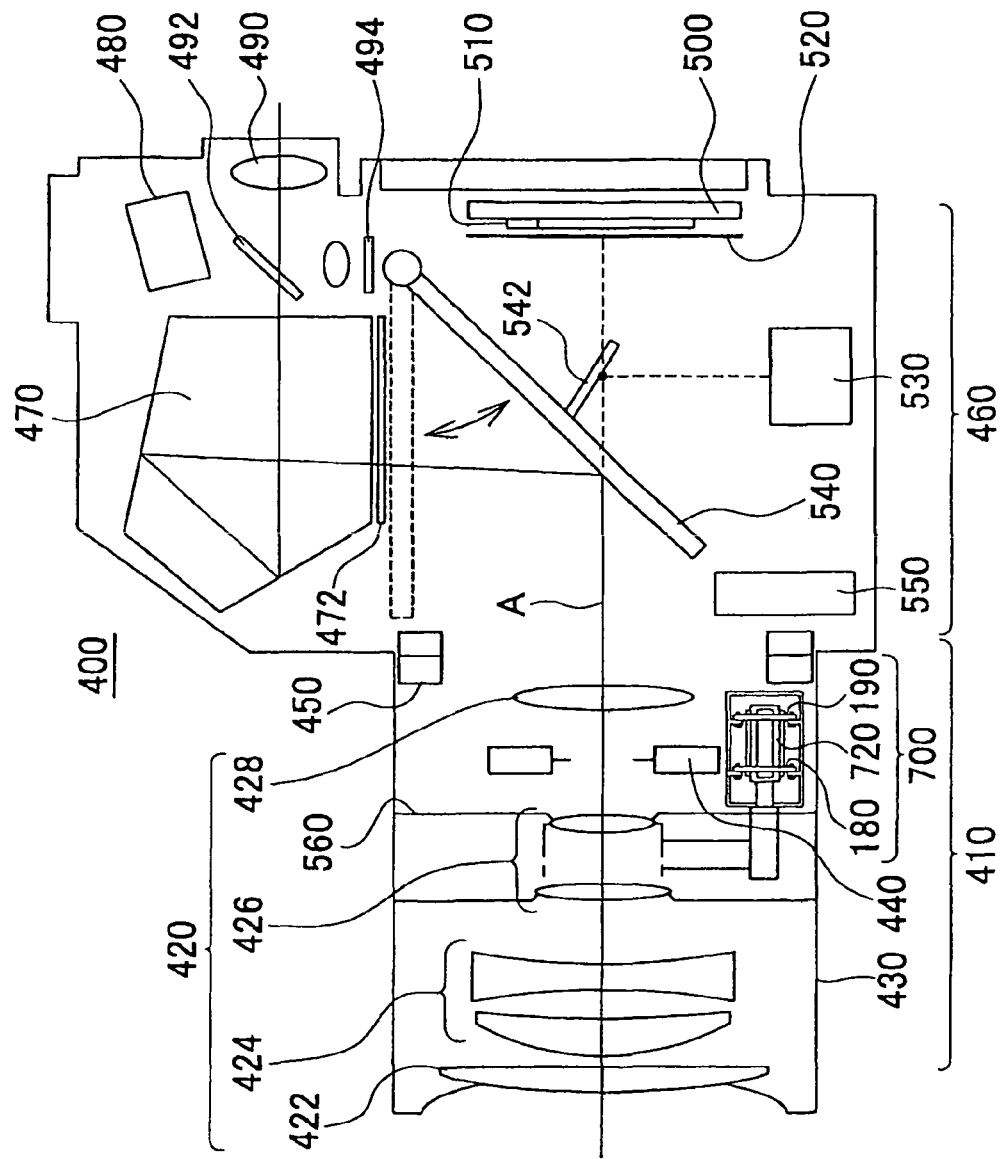
F I G. 28

VIBRATION ACTUATOR FOR ROTATING A ROTATING AXLE AND IMAGE CAPTURING APPARATUS

CROSS-REFERENCE TO RELATED APPLICATIONS

This is a continuing application, filed under 35 U.S.C. §111(a), of International Application PCT/JP2008/003636, filed Dec. 5, 2008, it being further noted that foreign priority benefit is based upon Japanese Patent Applications 2007-317736, filed Dec. 7 2007 and 2008-014158, filed Jan. 24, 2008, the entire disclosures of which are incorporated by reference as part of this application.

BACKGROUND

1. Technical Field

The present invention relates to a vibration actuator. In particular, the present invention relates to a vibration actuator that rotates a rotating axle via vibrational movement, and to an image capturing apparatus including this vibration actuator.

2. Related Art

A known vibration actuator converts ultrasonic vibration into rotational movement or linear movement. This vibration actuator includes electromechanical transducers that are formed using piezoelectric material. The vibration actuator converts vibration, which is generated by applying a periodically changing drive voltage to the electromechanical transducers, into rotational motion or linear motion, and transmits this motion to an external drive receiving portion.

As an example of such a vibration actuator, U.S. Pat. No. 6,940,209 discloses an ultrasonic lead screw motor. This ultrasonic motor includes (i) a rectangular elastic body having a through-hole with a screw groove formed near the ends thereof on the inner surface, (ii) four electromechanical transducers mounted respectively on the four sides of the rectangular elastic body, and (iii) a screw shaft that is inserted and screwed into the through hole. Vibration of the elastic body caused by applying a periodic drive voltage with a phase that is sequentially delayed by π/2 to the four electromechanical transducers is converted into screwing movement of the screw shaft, and so the screw shaft moves in the axial direction.

In the ultrasonic motor of Patent Document 1, however, the rotational force is achieved via linear contact between the threaded portion of the screw shaft and the screw groove of the through-hole, and so in order to achieve a large amount of torque, the clearance between the threaded portion of the screw shaft and the screw groove of the through-hole must be decreased or a biasing member must be used. Even when the clearance between the screw groove and the threaded portion of the screw shaft is decreased or a biasing member is used, rotation occurs with the threaded portion being pressed against the screw groove, which causes extreme wear on the threaded portion and screw groove.

SUMMARY

Therefore, it is an object of an aspect of the innovations herein to provide a vibration actuator and an image capturing apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary vibration actuator may comprise a drive unit that generates a drive force; a vibrating component that vibrates according to the drive force from the drive unit; a rotating body that receives the vibration of the vibrating component to rotate; and a converting section that changes a contact force between the vibrating component and the rotating body according to size of a load acting on the rotating body.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 9 is a schematic view of another embodiment of an elastic member.

FIG. 12 is a cross-sectional view of the vibration actuator 100.

FIG. 14 shows an operation of the converting section 300.

FIG. 15 is an exploded perspective view of a vibration actuator 100.

FIG. 20 is a cross section taken along the line B-B' of FIG. 16 in a state where torque greater than a reference amount is applied to the rotating axle 140.

FIG. 28 is a schematic cross-sectional view of the configuration of an image capturing apparatus 400.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
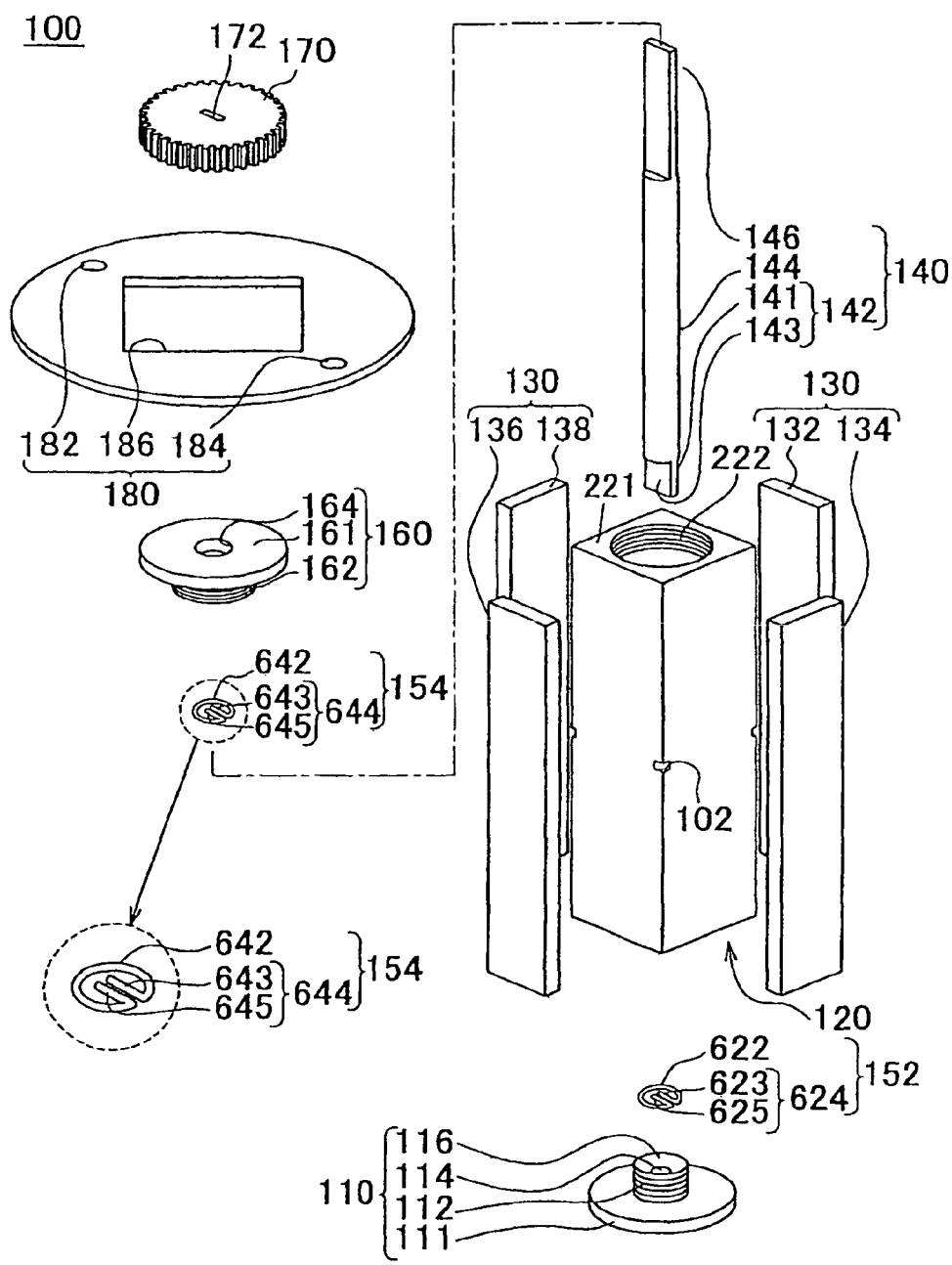
FIG. 1 is an exploded perspective view of a vibration actuator 100.

FIG. 1 is an exploded perspective view of a vibration actuator 100 according to an embodiment of the present invention. In the following description, each component has top and bottom ends in the axial direction, with the same orientation as shown in FIG. 1. The radial direction is sometimes referred to as the "horizontal" direction. However, this does not mean that the use of the vibration actuator 100 is limited to the orientation shown in FIG. 1.

The vibration actuator 100 includes a rotating axle 140, a vibrating member 120 that is arranged coaxially with the rotating axle 140 and that vibrates, a drive unit 130 that causes the vibrating member 120 to vibrate, and elastic members 152 and 154. The elastic members 152 and 154 bias at least one of the rotating axle 140 and the vibrating member 120 toward the other in the radial direction, and rotate the rotating axle 140 by transmitting the vibrational movement of the vibrating member 120 to the rotating axle 140.

The vibration actuator 100 includes adjusting sections 110 and 160 that rotatably support the rotating axle 140, and an output gear 170 that transmits the rotation of the rotating axle 140 to the outside. The vibration actuator 100 also includes a holding member 180 that supports the vibrating member 120 at the positions of vibration nodes of the vibrating member 120.

The rotating axle 140 includes a cylindrical rotating axle body 144 and non-circular portions 142 and 146 that are formed near the ends of the rotating axle body 144 in the radial direction. The rotating axle body 144 and the non-circular portions 142 and 146 are formed integrally. The non-circular portions 142 and 146 may be formed by a pair of flat surfaces that are parallel to each other and that extend radially to the ends of the rotating axle body 144.

The vibrating member 120 is formed as a cylinder with a circular inner circumference, is shorter than the rotating axle 140, and includes a through-hole that passes longitudinally therethrough. The through-hole has a circular cross section and has an inner diameter that is greater than the outer diameter of the integrated rotating axle body 144. By inserting the rotating axle 140 through the through-hole of the vibrating member 120 such that the longitudinal direction of the vibrating member 120 is parallel to the axial direction of the rotating axle 140, the vibrating member 120 and the rotating axle 140 can be arranged coaxially, at least when in a resting state.

The through-hole has a thread groove 222 positioned near the top end thereof. In the present embodiment, the vibrating member 120 has a square outer circumference. The outer diameter of the vibrating member 120 is not limited to being square, and may instead be a prism, a cylinder, or a cylinder having a flat surface as at least a portion of its outer surface. The vibrating member 120 can be formed of various metals, plastics, or ceramics.

The drive unit 130 includes three or more electromechanical transducers arranged on the outer surface of the vibrating member 120 at different positions in the circumferential direction of the vibrating member 120. In the embodiment shown in FIG. 1, the drive unit 130 includes electromechanical transducers 132, 134, 136, and 138 arranged on the outer surface of the vibrating member 120 at different positions in the circumferential direction of the vibrating member 120. In this case, the electromechanical transducers 132, 134, 136, and 138 are respectively arranged on the four sides of the vibrating member 120 with a square outer surface. The electromechanical transducers 132, 134, 136, and 138 each have substantially the same dimensions, and are formed to have lengths in the longitudinal direction of the vibrating member 120.

The electromechanical transducer elements 132, 134, 136, and 138 include piezoelectric materials that expand when a drive voltage is applied thereto. Examples of such piezoelectric materials include lead zirconate titanate, crystal, lithium niobate, barium titanate, lead titanate, lead metaniobate, polyvinylidene difluoride, lead zinc niobate, lead scandium niobate, and the like.

Many piezoelectric materials are fragile, and so these materials are desirably reinforced with a highly elastic metal such as phosphor bronze. Instead, the vibrating member 120 itself may serve as a support structure and the electromechanical transducer elements 132, 134, 136, and 138 may be formed by creating a piezoelectric material layer on the surface of the vibrating member 120. The electrodes used when applying the drive voltage to the piezoelectric material may be made of nickel, gold, or the like and formed directly on the surface of the dielectric material using techniques such as plating, sputtering, vapor deposition, or thin film printing.

The electromechanical transducers 132, 134, 136, and 138 may be directly affixed to the vibrating member 120 using adhesion. As a result, when the drive voltage is applied by the drive unit 130 to expand one of the electromechanical transducer elements 132, 134, 136, and 138, the portion to which this one of the electromechanical transducer elements 132, 134, 136, and 138 is affixed expands together with the vibrating member 120. For example, by applying voltages with 90 degree phase differences in a clockwise or counter-clockwise direction to the electromechanical transducers, the vibrating member 120 exhibits vibrational movement in the clockwise or counter-clockwise direction.

The vibrating member 120 further includes notches 102 on the outer surface thereof. The notches 102 are provided at positions near the nodes of the vibrational movement of the vibrating member 120. In the present embodiment, the notches 102 are positioned on the outer surface of the vibrating member 120 in the middle thereof in the axial direction, and four notches 102 are positioned at the four corners between respective pairs of electromechanical transducers.

The pair of elastic members 152 and 154 are arranged near the ends of the vibrating member 120 in the axial direction. The elastic member 152 includes a circular portion 622 that has a shape tracing the inner circumference of the vibrating member 120 and a grasping portion 624 that sandwiches the non-circular portion 142 of the rotating axle 140. The grasping portion 624 extends from the ends of the circular portion 622 toward the inside of the circular portion 622, and is shaped to trace the outer surfaces of the non-circular portion 142 of the rotating axle 140. For example, when the non-circular portion 142 has two flat surfaces 141 and 143 that are parallel to each other, as in the present embodiment, the grasping portion 624 includes a pair of linear portion 623 and 625. The linear portions 623 and 625 sandwich the non-circular portion 142 of the rotating axle 140, thereby gently coupling the elastic member 152 to the rotating axle 140.

The circular portion 622 contacts the inclined surface 116 of the adjusting section 110 and the inner circumference of the vibrating member 120, and when rotated by the vibrating member 120, transmits this rotational force to the rotating axle 140. In the present embodiment, the circular portion 622 rotates together with the rotating axle 140. In the present embodiment, the elastic member 154 has the same structure and function as the elastic member 152, and so a detailed description thereof is omitted.

The adjusting section 110 includes a flange 111 and a threaded screw portion 112. The flange 111 is formed as a disc that is inscribed in the square formed by the outer cross section of the vibrating member 120. The outer diameter of the flange 111 is greater than the inner diameter of the through-hole of the vibrating member 120. A bearing 114 that rotatably supports the rotating axle body 144 is formed in a central region of the flange 111. The inner diameter of the bearing 114 may be larger than the outer diameter of the rotating axle 140.

The adjusting section 110 has an inclined surface 116 with an annular bowl-shaped inner surface positioned at the end thereof near the vibrating member 120. In the present embodiment, the adjusting section 160 has the same structure as the adjusting section 110.

The top and bottom ends of the rotating axle 140 extend outside through the bearing units 114 and 164 of the adjusting sections 110 and 160. The rotating axle 140 extends further outward on the top side, so that the output gear 170 can be attached on the top end.

The output gear 170 has, in the center thereof, an axle hole 172 with an inner surface that engages with the non-circular portion 146 of the rotating axle 140. When the non-circular portion 146 is inserted in the axle hole 172, the output gear 170 rotates integrally with the rotating axle 140. The output gear 170 is attached to one end of the rotating axle 140 in the present example. However, by extending the rotating axle 140 further downward, output gears 170 can be attached to both ends of the rotating axle 140.

The position of the rotating axle 140 is fixed while allowing for rotation by the bearing units 114 and 164 of the adjusting sections 110 and 160. The bearing units 114 and 164 may be rolling bearings, sliding bearings, or the like. The gap between (i) the bearing units 114 and 164 and (ii) the rotating axle 140 is small enough to prevent dust from entering the vibrating member 120.

The holding member 180 supports the vibrating member 120 near the axial center thereof. Therefore, the holding member 180 supports the vibrating member 120 at a position near the node of the vibrational movement of the vibrating member 120. The holding member 180 includes mounting holes 182 and 184 into which are inserted screws or the like, and an aperture 186 into which the vibrating member 120 is inserted. The holding member 180 may be disc-shaped. The holding member 180 is elastic to accommodate the vibrational movement of the vibrating member 120.

The aperture 186 is square, and each edge of this square is (i) longer than an edge of the square cross section of the vibrating member 120 and (ii) slightly shorter than the diagonal line bisecting the square cross section of the vibrating member 120. The electromechanical transducers 132, 134, 136, and 138 are inserted through the aperture 186 along with the vibrating member 120.

The holding member 180 supports the vibrating member 120 from the outer surface thereof. In the embodiment of FIG. 1, the holding member 180 supports the vibrating member 120 by engaging at least a portion of the aperture 186 with the notches 102 of the vibrating member 120. In this case, after the vibrating member 120 is inserted into the aperture 186 while a side of the aperture 186 of the holding member 180 is parallel to a side of the vibrating member 120, the vibrating member 120 can rotate on an axis. As a result, by engaging each side of the square aperture 186 with a notch 102 of the vibrating member 120, the holding member 180 supports the vibrating member 120.

Figure 2:
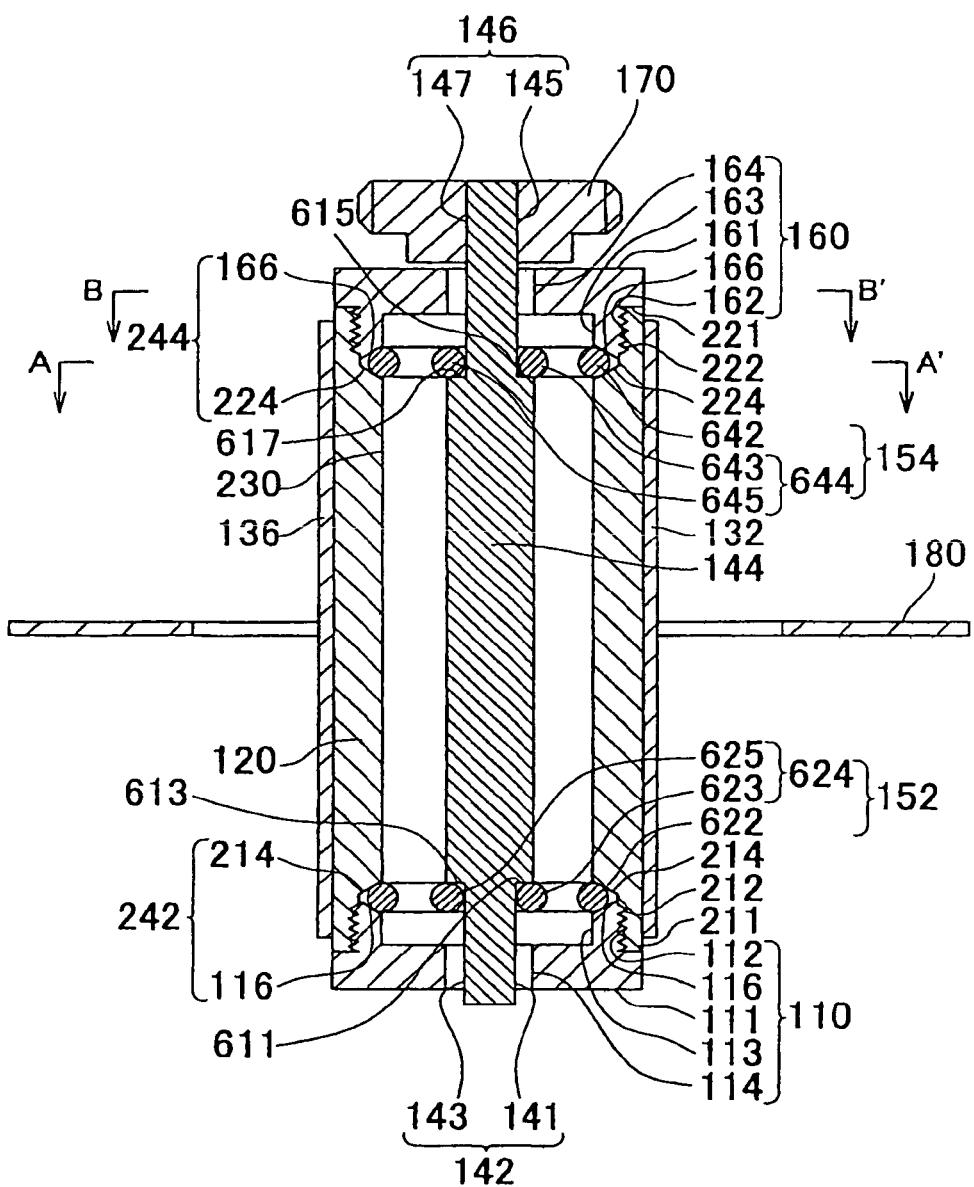
FIG. 2 is a cross-sectional view, in the axial direction, of the vibration actuator 100.

FIG. 2 is a cross-sectional view, in the axial direction, of the vibration actuator 100. Components that are the same as those shown in FIG. 1 are given the same reference numerals, and redundant descriptions are omitted.

As shown in FIG. 2, the rotating axle 140 includes the non-circular portion 142 near one end thereof. The non-circular portion 142 has a diameter that differs depending on a position in the circumferential direction, at least in a region near a position at which the rotating axle 140 and the elastic member 152 contact each other.

The non-circular portion 142 shown in FIG. 2 has flat surfaces 141 and 143 that are parallel to each other. The rotating axle 140 includes stepped portions 611 and 613 at a boundary between (i) the flat surfaces 141 and 143 and (ii) the rotating axle body 144. In the present embodiment, the outer diameter of the non-circular portion 142 is less than or equal to the outer diameter of the rotating axle body 144. Instead, if the outer diameter of the non-circular portion 142 differs depending on the position in the circumferential direction, then the outer diameter of the non-circular portion 142 may be greater than the outer diameter of the rotating axle body 144.

In the present embodiment, the flat surfaces 141 and 143 extend in the axial direction from the ends of the rotating axle 140 to a position at which the rotating axle 140 and the elastic member 152 contact each other. Instead, the flat surfaces 141 and 143 may be arranged near the position at which the rotating axle 140 and the elastic member 152 contact each other, and other portions, such as the ends of the rotating axle 140, may be cylinders having the same diameter as the rotating axle body 144.

The rotating axle 140 includes the non-circular portion 146 at another end thereof. The non-circular portion 146 has flat surfaces 145 and 147 that are parallel to each other. In the present embodiment, the non-circular portion 146 has the same structure as the non-circular portion 142, the flat surface 145 has the same flat structure as the flat surface 141, and the flat surface 147 has the same flat structure as the flat surface 143, but it is not necessary that these components have the same flat structure. The rotating axle 140 includes stepped portions 615 and 617 at a boundary between (i) the flat surfaces 145 and 147 and (ii) the rotating axle body 144.

As shown in FIG. 2, the vibrating member 120 has a bottom end surface 211 and a thread groove 212 at one end thereof and has a top end surface 221 and a thread groove 222 at the other end thereof. The bottom end surface 211 and the top end surface 221 include flat surfaces that are perpendicular to the axial direction. The vibrating member 120 includes an inner portion 230 whose cross section is a circle extending in the axial direction. The inner diameters of the thread grooves 212 and 222 are each greater than the inner diameter of the inner portion 230, and inclined surfaces 214 and 224 with annular bowl-shaped surfaces are formed respectively between (i) the thread grooves 212 and 222 and (ii) the inner portion 230.

The adjusting sections 110 and 160 are mounted at both longitudinal ends of the vibrating member 120 by threading the thread grooves 212 and 222 with the threaded screw portions 112 and 162. As a result, a V-shaped groove 242 contacting the elastic member 152 is formed near the bottom end of the inner circumference of the vibrating member 120. The adjusting sections 110 and 160 may be attached to the vibrating member 120 using other methods such as interlocking. The adjusting sections 110 and 160 have the same structure and function as each other, and so the following describes only the adjusting section 110.

The V-shaped groove 242 may have substantially the same position in the axial direction as the stepped portions 611 and 613 of the rotating axle 140. As a result, the bias force of the elastic member 152 is in a direction that is substantially perpendicular to the axial direction, and so the elastic member 152 can bias the rotating axle 140 and the vibrating member 120 toward each other in the radial direction, in a substantially symmetric manner. The inclination of the inclined surface 116 and the inclination of the inclined surface 214 are preferably symmetric relative to a surface that is perpendicular to the axis. Instead, one of the vibrating member 120 and the adjusting section 110 may be an inclined surface, and the other may be a surface that is perpendicular to the axis.

As described above, since the adjusting sections 110 and 160 are arranged on the vibrating member 120, the position in the radial direction at which the vibrating member 120 contacts the elastic members 152 and 154 can be adjusted. For example, by adjusting the amount by which the adjusting section 110 is screwed in, one of the inclined surfaces 116 and 214 of the V-shaped groove 242 facing each other can be brought closer to or moved away from the other. As a result, the bias force of the elastic member 152 can be adjusted. In the same way, the adjusting section 160 can adjust the bias force of the elastic member 154.

The elastic members 152 and 154 are arranged such that their bias forces affect the inner portions of the through-holes of the vibrating member 120 in a direction perpendicular to the axial direction. The elastic members 152 and 154 contact and press against the V-shaped grooves 242 and 244, and so the radial movement due to the vibration of the vibrating member 120 is transmitted via the inclined surfaces 214 and 224. Since the non-circular portions 142 and 146 run along the periphery of the non-circular portions 142 and 146 of the rotating axle 140, the elastic members 152 and 154 can efficiently transmit the vibrational movement of the vibrating member 120 to the rotating axle 140. With the above configuration, the vibrational movement of the vibrating member 120 provides rotational drive to the rotating axle 140.

Figure 3:
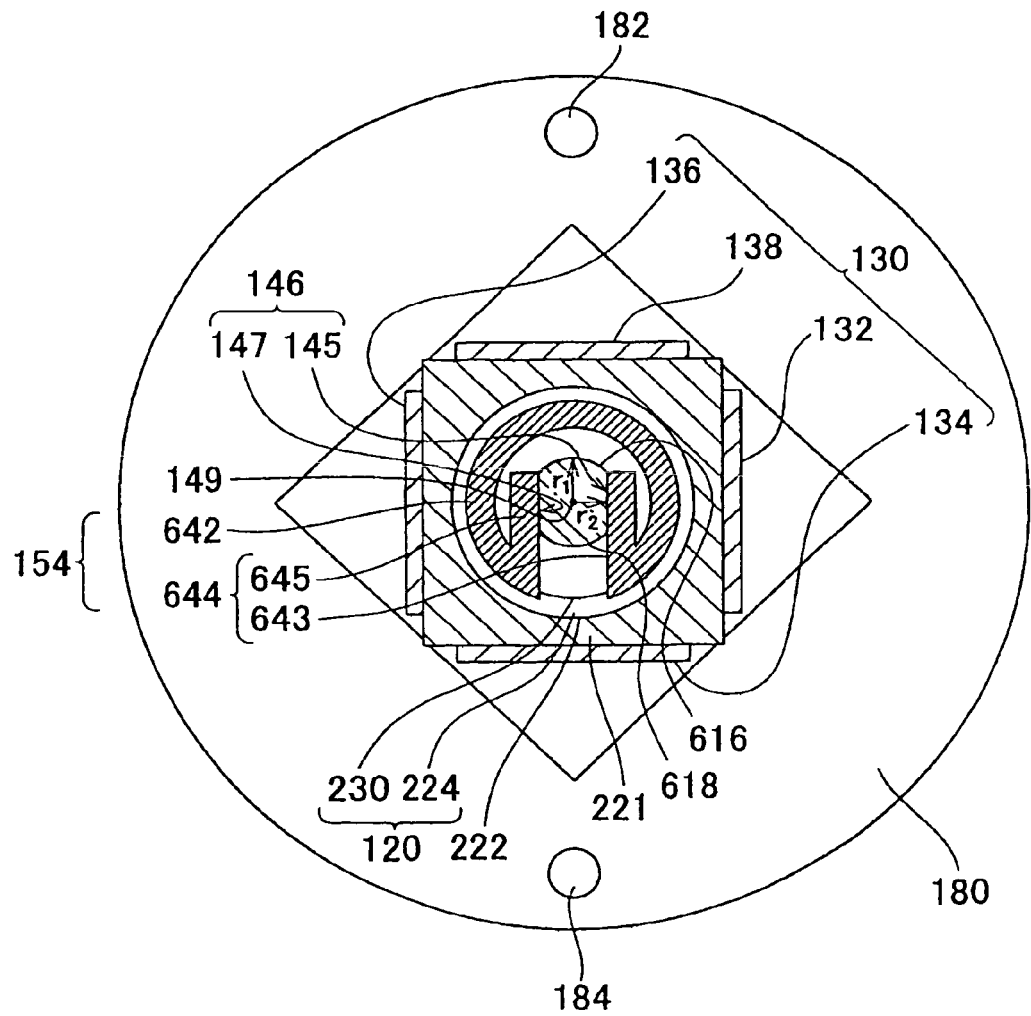
FIG. 3 is a cross-sectional view of the vibrating member 120 taken along the line A-A'.

FIG. 3 is a cross-sectional view of the vibrating member 120 taken along the line A-A'. As shown in FIG. 3, when in a resting state, the vibrating member 120, the rotating axle 140, and the elastic member 154 are arranged coaxially on the radially-centered rotational center 149, and the non-circular portion 146 of the rotating axle 140 includes flat surfaces 145 and 147 and arc-like portions 616 and 618. The distance $r_1$ between the rotational center 149 of the rotating axle 140 and each of the arc-like portions 616 and 618 is greater than the distance $r_2$ between the rotational center 149 and each of the flat surfaces 145 and 147. The linear portions 643 and 645 of the elastic member 154 sandwich the flat surfaces 145 and 147 of the rotating axle 140. Furthermore, the circular portion 642 of the elastic member 154 contacts the entire surface of the inclined surface 224 of the vibrating member 120.

Figure 4:
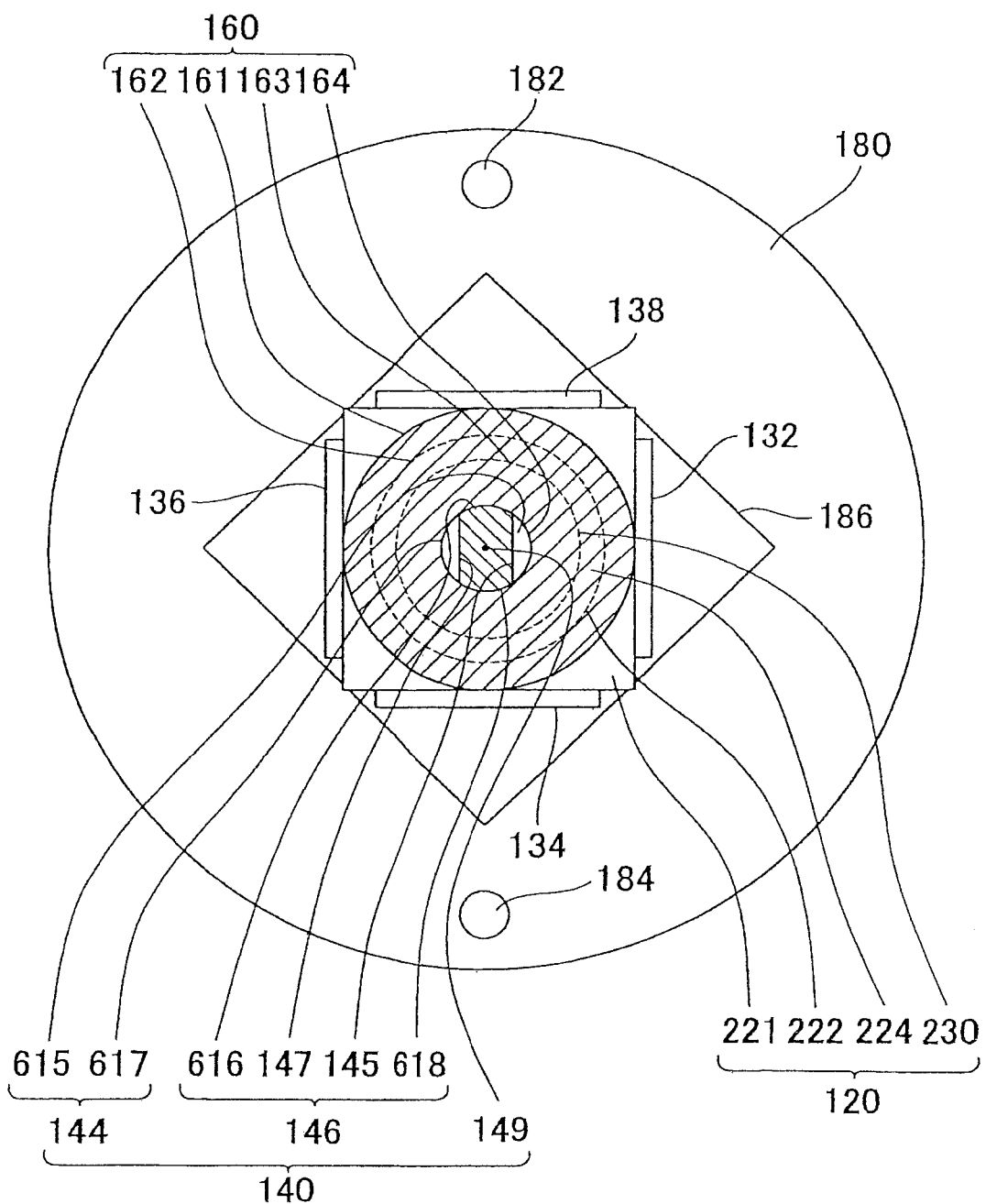
FIG. 4 is a cross-sectional view of the vibrating member 120 taken along the line B-B'.

FIG. 4 is a cross-sectional view of the vibrating member 120 taken along the line B-B'. For ease of explanation, the elastic member 154 is not shown in FIG. 4. As shown in FIG. 4, when in a resting state, the vibrating member 120, the rotating axle 140, and the adjusting section 160 are arranged coaxially on the radially-centered rotational center 149. The inner diameter of the bearing 164 of the adjusting section 160 is substantially equal to the outer diameter of each of the arc-like portions 616 and 618. The diameter of each of the inner surface 163 and 113 of the adjusting sections 160 and 110 is substantially equal to the inner diameter of the inner portion 230.

Figure 5A:
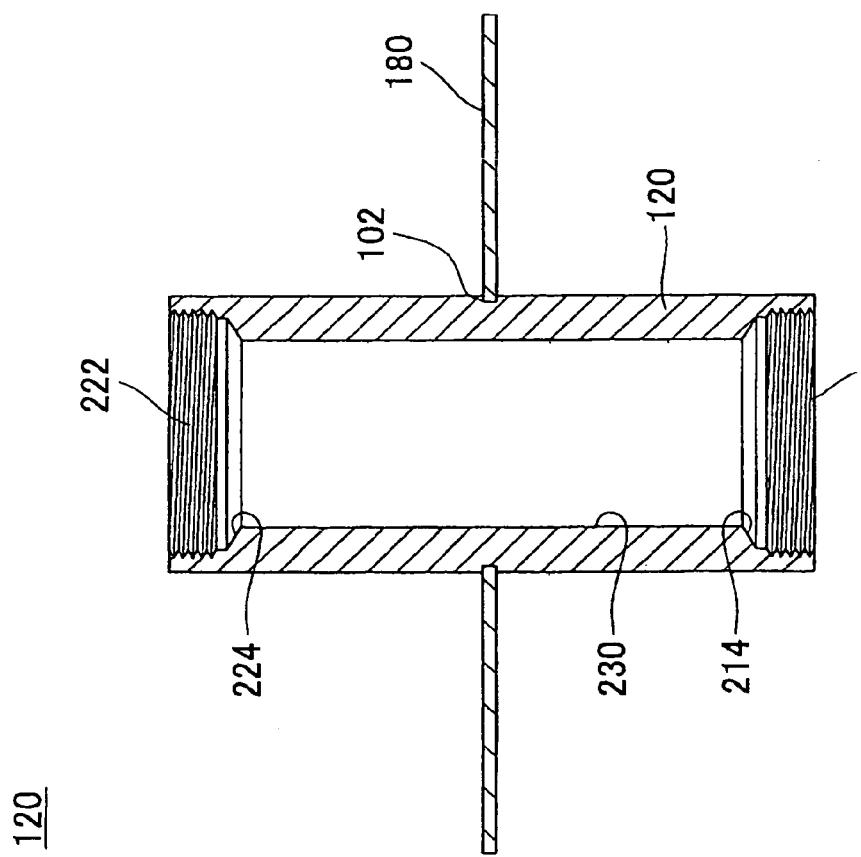
FIG. 5A is a schematic diagram showing the vibrational movement of the vibrating member 120.
Figure 5B:
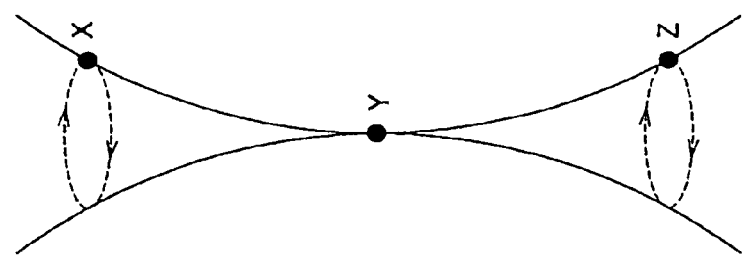
FIG. 5B is a schematic diagram showing the vibrational movement of the vibrating member 120.

FIGS. 5A and 5B are schematic diagrams showing the vibrational movement of the vibrating member 120. When the drive voltage is applied to the drive unit 130, the vibrating member 120 extends together with the extending of the electromechanical transducers 132, 134, 136, and 138 of the drive unit 130, such that the vibrating member 120 bends.

When the drive voltage is applied to the each of the electromechanical transducer elements 132, 134, 136, and 138 sequentially in a direction of the circumference of the vibrating member 120, the curve of the vibrating member 120 sequentially changes. When an AC electric field with a phase sequentially delayed by $\pi/2$ is applied to each of the electromechanical transducer elements 132, 134, 136, and 138, the vibrating member 120 vibrates in a circular motion orthogonal to the plane of FIG. 5A.

The vibrating member 120 is supported by the holding member 180 at the notches 102 formed near the longitudinal center of the vibrating member 120, and so when vibrating, the vibrating member 120 forms antinodes X and Z near the ends thereof, which each trace a circle orthogonal to the plane of FIG. 5A. As a result, the entire vibrating member 120 vibrates with a node Y near the center thereof and antinodes X and Z near the ends thereof.

The horizontal movement of the vibrating member 120 during vibration is greatest at the longitudinal positions of the antinodes. Therefore, by contacting the elastic members 152 and 154 at the portions of the vibrating member 120 shown by the antinodes X and Z during vibration, the rotating axle 140 is efficiently rotated in the circumferential direction.

The frequency of the drive voltage applied to the drive unit 130 desirably includes a resonance frequency corresponding to the characteristic frequency of the vibrating member 120. Therefore, the vibrating member 120 is efficiently vibrated by the drive power provided thereto, and this vibration can be continued. The vibrating member 120 may have another vibration mode that uses a plurality of nodes and antinodes.

With the above configuration, when the rotational load for the rotating axle 140 is smaller, the clearance between the rotating axle 140 and the vibrating member 120 is larger, and so the number of revolutions increases when the rotational load is smaller. Furthermore, when the rotational load is smaller, the contact force between (i) the rotating axle 140 and (ii) the elastic members 152 and 154 and between (iii) the vibrating member 120 and (iv) the elastic members 152 and 154 decreases, and so the friction between the rotating axle 140, the elastic members 152 and 154, the vibrating member 120, and the like can be reduced.

Figure 6:
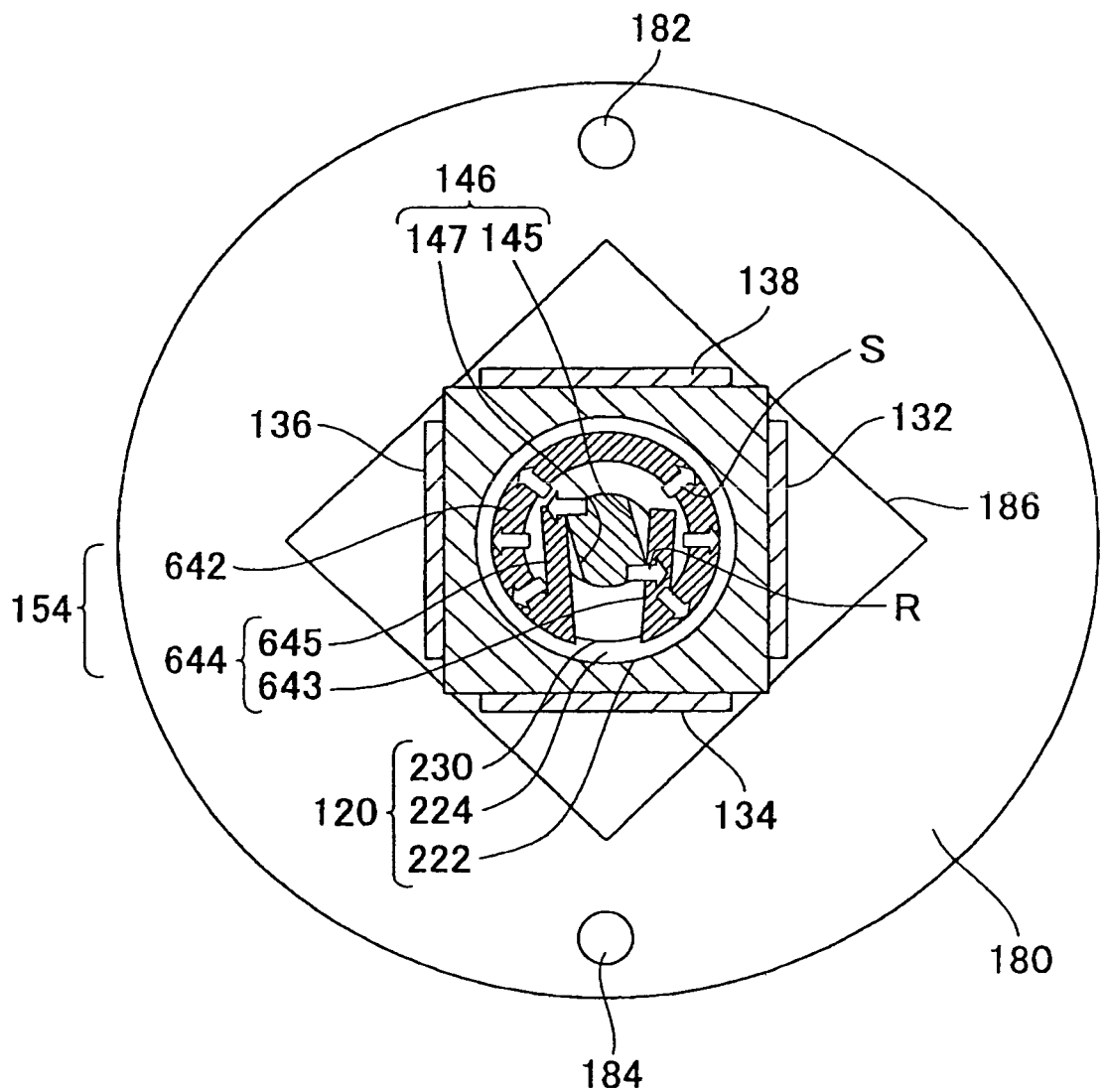
FIG. 6 is a cross-sectional view of the vibrating member 120 taken along the line A-A'.

FIG. 6 is a cross-sectional view of the vibrating member 120 taken along the line A-A', when a large rotational load is placed on the rotating axle 140. When a large rotational load is placed on the rotating axle 140, the non-circular portion 146 that is gently sandwiched by the grasping portion 644 of the elastic member 154 rotates later than the elastic member 154. In other words, the non-circular portion 146 rotates relative to the grasping portion 644.

At this time, a pressing force R is exerted on the elastic member 154, and so the flat surfaces 145 and 147 of the non-circular portion 146 push apart the linear portions 643 and 645 of the elastic member 154. When the linear portions 643 and 645 are pushed away from each other, the bias force S pressing on the inclined surface 224 of the circular portion 642 increases. Therefore, the elastic member 154 is widened further and a larger bias force is generated when the rotational load on the rotating axle 140 is larger. In other words, since the diameter of the non-circular portion 146 differs depending on the position in the circumferential direction, the rotating axle 140 and the elastic member 154 are again gently coupled when equilibrium is reached between the rotational load of the rotating axle 140 and the holding force exerted on the non-circular portion 146 by the elastic member 154. On the other hand, when the rotational load of the rotating axle 140 is small, the pressing force exerted on the linear portions 643 and 645 of the elastic member 154 by the flat surfaces 145 and 147 of the non-circular portion 146 decreases, thereby decreasing the bias force of the elastic member 154.

With the above configuration, when the rotational load for the rotating axle 140 is larger, the clearance between the rotating axle 140 and the vibrating member 120 is smaller. Furthermore, when the rotational load for the rotating axle 140 is smaller, the clearance between the rotating axle 140 and the vibrating member 120 is larger.

As a result, when the rotational load is large, such as when the rotating axle 140 begins rotating, the elastic members 152 and 154 press strongly on the vibrating member 120, and so a large amount of friction occurs between (i) the vibrating member 120 and (ii) the elastic members 152 and 154, and a large moving force is transmitted. The rotational load decreases as the rotating axle 140 rotates, and so the bias described above also decreases. As a result, the rotational resistance of the rotating axle 140 decreases, and so the rotational speed of the vibration actuator 100 can be increased. Furthermore, the friction experienced by the rotating axle 140, the elastic members 152 and 154, the vibrating member 120, and the like can be decreased.

Yet further, the circular portions 622 and 642 are pressed to the vibrating member 120 by the radial bias force of the elastic members 152 and 154. Therefore, the elastic members 152 and 154 can be thinned in the axial direction, and the vibration of the vibrating member 120 can be converted into rotational movement with a high torque, without increasing the axial length of the vibration actuator 100.

In the present embodiment, the elastic members 152 and 154 rotate together with the rotating axle 140 due to the vibrating member 120, but the elastic members 152 and 154 may be fixed to the vibrating member 120 in order to rotate the rotating axle 140. In this way, the elastic members 152 and 154 bias the vibrating member 120 radially toward the rotating axle 140, while maintaining axial symmetry. At this time, the rotating axle 140 may include inclined surfaces of a V-shaped groove or the like that contact the elastic members 152 and 154.

The present embodiment uses a drive unit 130 that includes four electromechanical transducer elements 132, 134, 136, and 138 arranged at uniform intervals, but the configuration of the drive unit 130 is not limited to this. The vibrating member 120 can achieve vibration using a drive unit 130 that includes three or more of the electromechanical transducers arranged around the circumference of the vibrating member 120.

Figure 7:
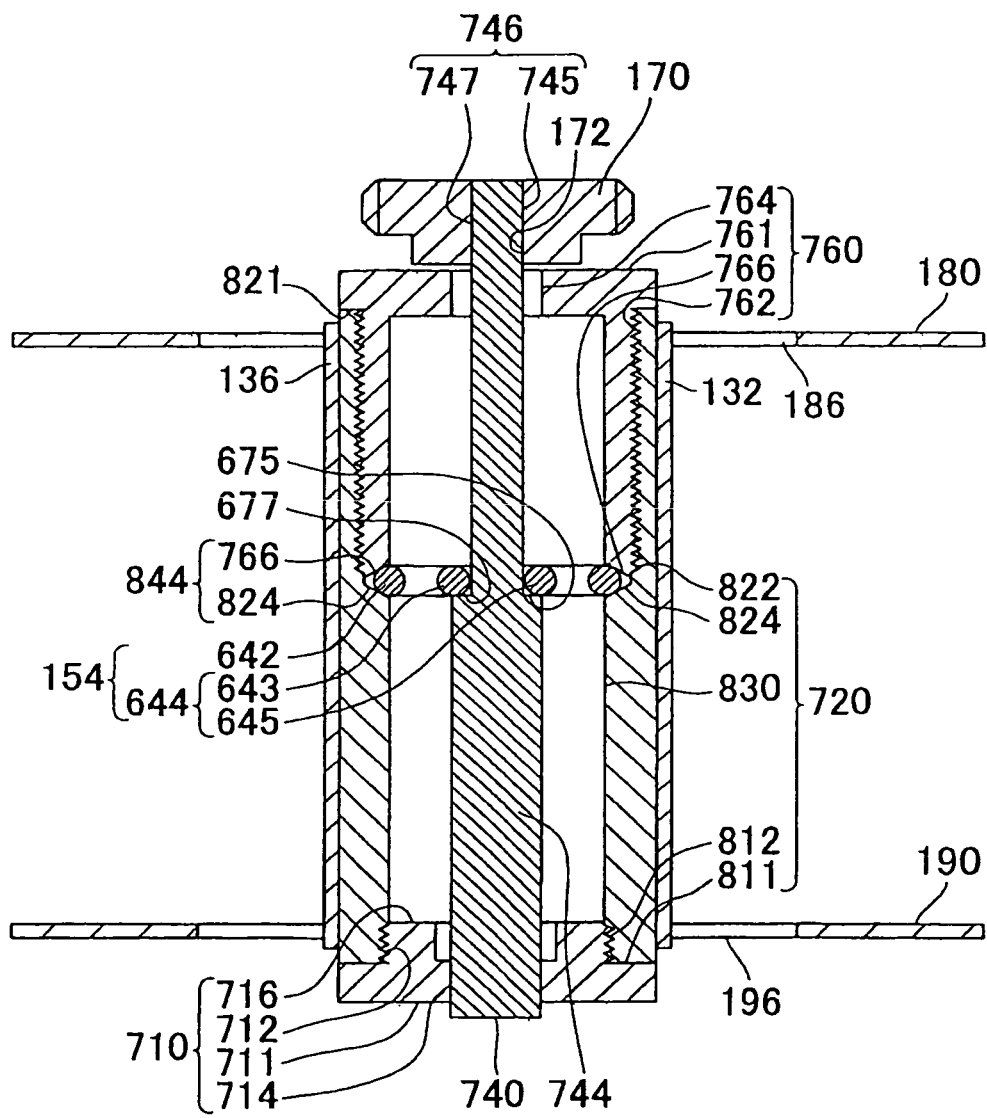
FIG. 7 is a cross-sectional view in the axial direction of the vibration actuator 700 according to another embodiment of the present invention.

FIG. 7 is a cross-sectional view in the axial direction of the vibration actuator 700 according to another embodiment of the present invention. The vibration actuator 700 includes a pair of holding members 180 and 190 that hold the vibrating member 720 near both axial ends thereof, and the elastic member 154 is arranged near the axial center of the vibrating member 720.

The vibration actuator 700 includes a rotating axle 740, a vibrating member 720 that is arranged coaxially with the rotating axle 740 and that vibrates, a drive unit 130 that causes the vibrating member 720 to vibrate, and an elastic member 154. The elastic member 154 biases at least one of the rotating axle 740 and the vibrating member 720 toward the other in the radial direction, and rotates the rotating axle 740 by transmitting the vibrational movement of the vibrating member 720 to the rotating axle 740.

With the above configuration, when the rotational load for the rotating axle 740 is smaller, the clearance between the rotating axle 740 and the vibrating member 720 is larger, and so the number of revolutions increases when the rotational load is smaller. Furthermore, when the rotational load is smaller, the contact force between the rotating axle 740 and the elastic member 154 and between the vibrating member 720 and the elastic member 154 decreases, and so the friction between the rotating axle 740, the elastic member 154, the vibrating member 720, and the like can be decreased.

The adjusting section 710, the vibrating member 720, the rotating axle 740, and the adjusting section 760 correspond respectively to the adjusting section 110, the vibrating member 120, the rotating axle 140; and the adjusting section 160 of the vibration actuator 100. Components that are the same as those in the vibration actuator 100 are given the same reference numerals, and redundant descriptions are omitted. The following description focuses on differences between corresponding parts, and explanations of similar components are omitted.

The rotating axle 740 includes a cylindrical rotating axle body 744 and a non-circular portion 746 that extends from a central region of the rotating axle body 744. The rotating axle body 744 and the non-circular portion 746 are formed integrally. The non-circular portion 746 has flat surfaces 745 and 747. Stepped portions 675 and 677 are formed at a boundary between (i) the flat surfaces 745 and 747 and (ii) the rotating axle body 744. The diameter of the non-circular portion 746 differs depending on a position in the circumferential direction.

The vibrating member 720 is formed as a rectangular cylinder with a circular inner circumference, is shorter than the rotating axle 740, and includes a through-hole that passes longitudinally therethrough. The through-hole has a circular cross section and has an inner diameter that is greater than the outer diameter of the integrated rotating axle body 744. The vibrating member 720 has a thread groove 822 formed above the central region of the through-hole and an inner portion 830 formed below the central region of the through-hole. The inner diameter of the thread groove 822 is greater than the inner diameter of the inner portion 830, and an inclined surface 824 with an annular bowl-shaped surface is formed between the thread groove 822 and the inner portion 830. A thread groove 812 is arranged at the bottom of the inner portion 830.

By inserting the rotating axle 740 through the through-hole of the vibrating member 720 such that the longitudinal direction of the vibrating member 720 is parallel to the axial direction of the rotating axle 740, the vibrating member 720 and the rotating axle 740 can be arranged coaxially. The drive unit 130 is arranged on the outer surface of the vibrating member 720.

The adjusting section 710 is screwed into the thread groove 812 of the vibrating member 720. The adjusting section 710 includes a bearing 714 that rotatably supports the rotating axle 740 and an inclined surface 716 that includes a horizontal surface. The adjusting section 710 stops the bottom end of the vibrating member 720 as a result of the flange 711 contacting the bottom end surface 811 of the vibrating member 720.

The adjusting section 760 is screwed into the thread groove 822 of the vibrating member 720. The adjusting section 760 includes a bearing 764 that rotatably support the rotating axle 740 and an inclined surface 766 having a bowl-shaped annular surface corresponding to the inclined surface 824. The inclined surface 766 and the inclined surface 824 form a V-shaped groove 844 contacting the elastic member 154, near the middle of the inner circumference of the vibrating member 720. By adjusting the amount that the adjusting section 760 is screwed in, the adjusting section 760 can adjust the bias force of the elastic member 154. When the flange 761 of the adjusting section 760 contacts the top end surface 821 of the vibrating member 720, the bias force of the elastic member 154 in a resting state is at a maximum.

The elastic member 154 is supported by the stepped portions 675 and 677 of the rotating axle 740 and by the V-shaped groove 844 of the vibrating member 720, and is arranged on the inner circumference of the vibrating member 720 such that the bias force of the elastic member 154 is in a direction substantially perpendicular to the axial direction. The linear portions 643 and 645 of the elastic member 154 sandwich the flat surfaces 745 and 747 of the rotating axle 740, thereby gently coupling the elastic member 154 to the rotating axle 740. The elastic member 154 can bias at least one of the rotating axle 740 and the vibrating member 720 toward the other in the radial direction, while maintaining axial symmetry, and can efficiently transmit the vibrational movement of the vibrating member 720 to the rotating axle 740. With the above configuration, the vibrational movement of the vibrating member 720 provides rotational drive to the rotating axle 740.

The output gear 170 has an axle hole 172 in the center thereof. The axle hole 172 has an inner surface that engages with the non-circular portion 746 of the rotating axle 740. When the non-circular portion 746 is inserted in the axle hole 172, the output gear 170 rotates integrally with the rotating axle 740.

The holding member 180 supports the vibrating member 720 near the top end thereof in the axial direction. The holding member 190 supports the vibrating member 720 near the bottom end thereof in the axial direction. The holding member 190 has the same structure as the holding member 180.

Figure 8B:
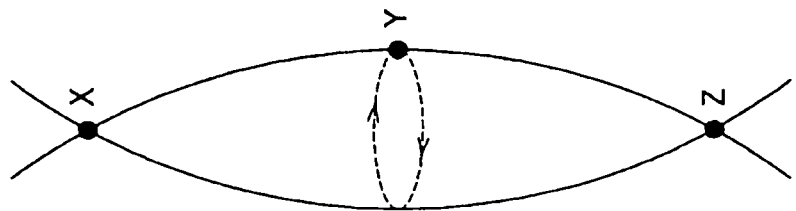
FIG. 8B is a schematic diagram showing the vibrational movement of the vibrating member 720.
Figure 8A:
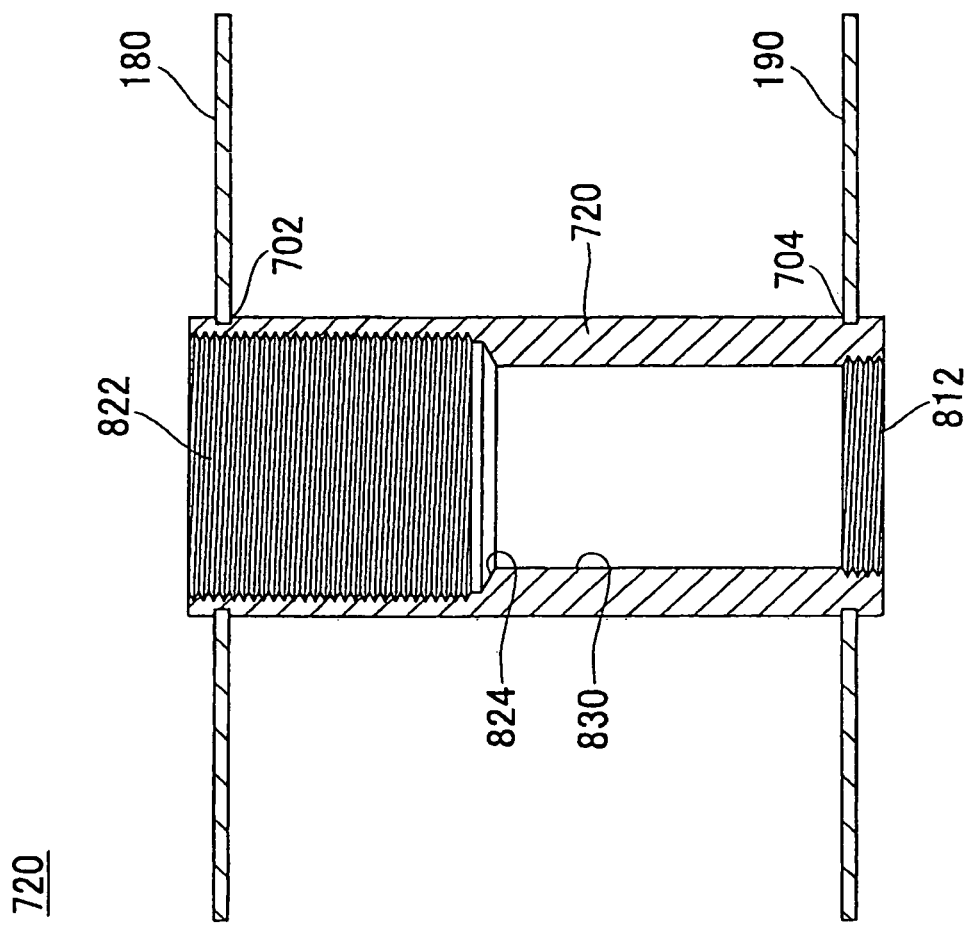
FIG. 8A is a schematic diagram showing the vibrational movement of the vibrating member 720.

FIGS. 8A and 8B are schematic diagrams showing the vibrational movement of the vibrating member 720. When the drive voltage is applied to the drive unit 130, the vibrating member 720 also extends, in the same manner as the vibrating member 120, such that the vibrating member 720 bends. When an AC electric field with a phase sequentially delayed by π/2 is applied to each of the electromechanical transducer elements 132, 134, 136, and 138 attached to the outer surface of the vibrating member 720, the vibrating member 720 vibrates in a circular motion orthogonal to the plane of FIG. 8A.

The vibrating member 720 is supported by the holding members 180 and 190 at the notches 702 and 704 formed near the ends of the vibrating member 720, and so when vibrating, the vibrating member 720 forms an antinode Y near the longitudinal center thereof, which traces a circle orthogonal to the plane of FIG. 8A. As a result, the entire vibrating member 720 vibrates with an antinode Y near the center thereof and nodes X and Z near the ends thereof.

The horizontal movement of the vibrating member 720 during vibration is greatest at the longitudinal position of the antinode Y. Therefore, by contacting the elastic member 154 at the portions of the vibrating member 720 shown by the antinode Y during vibration, the rotating axle 740 is efficiently rotated in the circumferential direction.

FIG. 9 is a schematic view of another embodiment of an elastic member. The elastic member 910 of the present embodiment is obtained by being punched from a thin metal plate, for example, and has the same function and effect as the elastic member 154. The elastic member 910 includes a circular portion 912 that has a shape tracing the inner circumference of the vibrating member 120 or the vibrating member 720, and a grasping portion 914 that sandwiches the non-circular portion 146 of the rotating axle 140 or the non-circular portion 746 of the rotating axle 740. The grasping portion 914 extends from the ends of the circular portion 912 toward the inside of the circular portion 912, and is shaped to trace the outer surfaces of the non-circular portion 146 of the rotating axle 140 or the non-circular portion 746 of the rotating axle 740. In the present embodiment, the grasping portion 914 has a pair of linear portions 913 and 915 that are flat boards.

Figure 10:
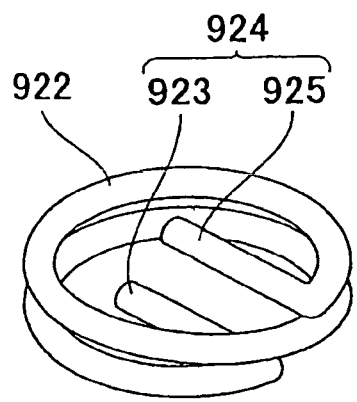
FIG. 10 is a schematic view of another embodiment of an elastic member.

FIG. 10 is a schematic view of yet another embodiment of an elastic member. The elastic member 920 of the present embodiment is formed as a spring with two coils, and has the same function and effect as the elastic member 154. The elastic member 920 includes a circular portion 922 that has a shape tracing the inner circumference of the vibrating member 120 or the vibrating member 720, and a grasping portion 924 that sandwiches the non-circular portion 146 of the rotating axle 140 or the non-circular portion 746 of the rotating axle 740. The grasping portion 924 extends from the ends of the circular portion 922 toward the inside of the circular portion 922, and is shaped to trace the outer surfaces of the non-circular portion 146 of the rotating axle 140 or the non-circular portion 746 of the rotating axle 740. In the present embodiment, the grasping portion 924 has a pair of linear portions 923 and 925.

In this case, the contact point of the circular portion 922 of the elastic member 920 is not limited to (i) the V-shaped grooves 242 and 244 formed by the vibrating member 120 and the adjusting sections 110 and 160 or (ii) the V-shaped groove 844 formed by the vibrating member 720 and the adjusting section 760. Instead of the V-shaped grooves 242, 244, and 844, the circular portion 922 of the elastic member 920 may contact the inner portion 230 or the inner portion 830, which are parallel to the axial direction, of the vibrating member 120 or the vibrating member 720, for example.

Figure 11:
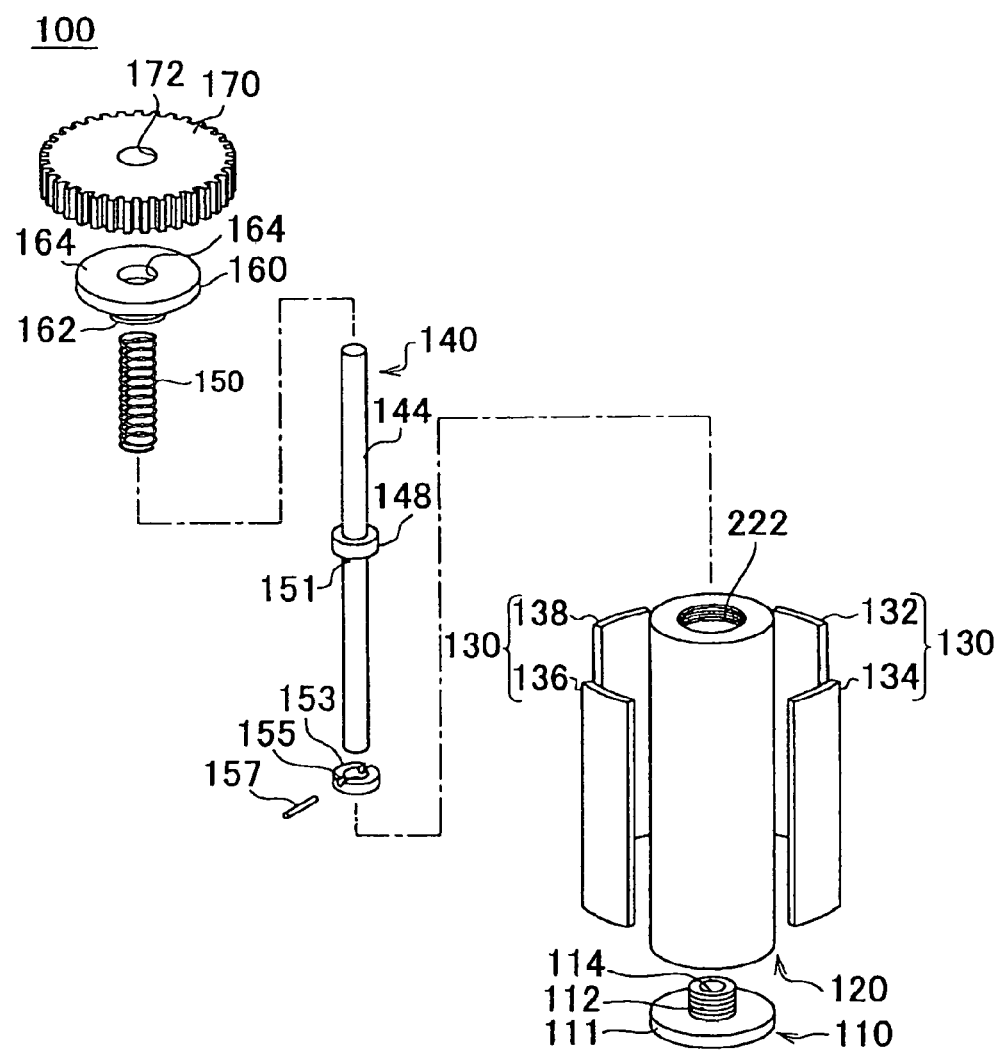
FIG. 11 is an exploded view showing the structure of another vibration actuator 100.

FIG. 11 is an exploded view showing the structure of another vibration actuator 100. Aside from points described below, the structure of the vibration actuator 100 is the same as the structure described in other embodiments. Therefore, identical components are given the same reference numerals, and redundant descriptions are omitted. In the following description, each component has top and bottom ends in the axial direction, with the same orientation as shown in FIG. 11. However, this does not mean that the use of the vibration actuator 100 is limited to the orientation shown in FIG. 11.

The vibration actuator 100 includes a vibrating member 120, a drive unit 130 that causes the vibrating member 120 to vibrate, a rotating axle 140 that contacts the vibrating member 120 at a central portion thereof and rotates in response to a drive force caused by the vibration of the vibrating member 120, and a rotating axle body 144 that includes a rotating flange 148 that rotates along with the drive force transmitting ring 153. The vibration actuator 100 includes adjusting sections 110 and 160 that rotatably support the rotating axle 140, a biasing member 150 that biases the rotating axle 140, and an output gear 170 that transmits the rotation of the rotating axle 140 to the outside.

The rotating axle 140 includes a cylindrical rotating axle body 144 and a rotating flange 148 formed integrally with the rotation transmitting axle 144 at the center of the rotating axle body 144 in the axial direction. The outer diameter of the rotating flange 148 is greater than the outer diameter of the rotating axle body 144.

The rotating axle 140 includes a drive force transmitting ring 153, which has an inner diameter substantially equal to the outer diameter of the rotating axle body 144 and an outer diameter substantially equal to the output diameter of the rotating flange 148, and a drive force transmitting axle 157 that is sandwiched between the drive force transmitting ring 153 and the rotating flange 148. The drive force transmitting axle 157 is inserted through an insertion hole 151 formed on a side surface of the rotating axle body 144. A V-shaped transmitting groove 155 that stops the drive force transmitting axle 157 is formed on the top surface of the drive force transmitting ring 153 and is oriented in the axial direction of the drive force transmitting ring 153.

The vibrating member 120 is a cylinder that is shorter than the rotating axle 140 and has a through-hole extending longitudinally therethrough. The through-hole has a circular cross section and has an inner diameter at an upper end thereof that is greater than the outer diameter of the rotating flange 148. The through-hole has thread grooves 122 and 222 positioned near the ends thereof. The vibrating member 120 can be formed of various metals, plastics, or ceramics.

The drive unit 130 includes electromechanical transducer elements 132, 134, 136, and 138 that have dimensions allowing arrangement at three or more, preferably four or more, regions. Each of the electromechanical transducer elements 132, 134, 136, and 138 has substantially the same dimensions, and is formed as a rectangle whose length is along the longitudinal direction of the vibrating member 120 and curved to wrap partially around the outer surface of the vibrating member 120.

The electromechanical transducer elements 132, 134, 136, and 138 include piezoelectric materials that expand when a drive voltage is applied thereto. Examples of such piezoelectric materials include lead zirconate titanate, crystal, lithium niobate, barium titanate, lead titanate, lead metaniobate, polyvinylidene difluoride, lead zinc niobate, lead scandium niobate, and the like.

Many piezoelectric materials are fragile, and so these materials are desirably reinforced with a highly elastic metal such as phosphor bronze. Instead, the vibrating member 120 itself may serve as a support structure and the electromechanical transducer elements 132, 134, 136, and 138 may be formed by creating a piezoelectric material layer on the surface of the vibrating member 120. The electrodes used when applying the drive voltage to the piezoelectric material may be made of nickel, gold, or the like and formed directly on the surface of the dielectric material using techniques such as plating, sputtering, vapor deposition, or thin film printing.

The adjusting section 110 includes a flange 111 and a threaded screw portion 112. The adjusting section 160 includes a flange 161 and a threaded screw portion 162. In the adjusting sections 110 and 160, the flanges 111 and 161 each have an external diameter that is greater than the internal diameter of the through-hole of the vibrating member 120. The flanges 111 and 161 each have an outer diameter that is greater than the inner diameter of the through-hole of the vibrating member 120.

Bearing units 114 and 164 having inner diameters that are substantially the same as the outer diameter of the rotating axle body 144 are formed in the center of the flanges 111 and 161. The threaded screw portions 112 and 162 have dimensions that allow for threading with the thread grooves 122 and 222 of the vibrating member 120.

The biasing member 150 has an outer diameter that is smaller than the outer diameter of the rotating flange 148, and has an inner diameter that is larger than the outer diameter of the rotating axle body 144. FIG. 11 shows this biasing member 150 as a coil spring through which the rotating axle 140 is inserted, but the structure is not limited to this.

The output gear 170 has an axle hole 172 in the center thereof. The axle hole 172 has an inner diameter suitable for accommodating the rotating axle body 144 of the rotating axle 140. When the rotating axle body 144 is inserted in the axle hole 172, the output gear 170 rotates integrally with the rotating axle 140.

FIG. 12 is a cross-sectional view of the vibration actuator 100 shown in FIG. 11. Components that are the same as those shown in FIG. 11 are given the same reference numerals, and redundant descriptions are omitted.

The drive unit 130 including the electromechanical transducers 132 and 136 is attached to the outer surface of the vibrating member 120. As a result, when the drive voltage is applied to expand one of the electromechanical transducer elements 132, 134, 136, and 138, the portion of the vibrating member 120 affixed to this one of the electromechanical transducer elements 132, 134, 136, and 138 also expands.

The through-hole of the vibrating member 120 has an inner diameter that is larger at the top and smaller at the bottom in FIG. 12. The slanted drive surface 121 formed in this way has an annular bowl-shaped surface along the inner surface of the vibrating member 120.

The adjusting sections 110 and 160 are mounted at both longitudinal ends of the vibrating member 120 by threading the thread grooves 122 and 222 with the threaded screw portions 112 and 162. The attached adjusting sections 110 and 160 are stopped at the ends of the vibrating member 120 by the flanges 111 and 161 contacting the end surfaces of the vibrating member 120.

In the present embodiment, the adjusting sections 110 and 160 are fixed by threading the threaded screw portion 112 of the adjusting section 110 with the thread groove 122 of the vibrating member 120 and threading the threaded screw portion 162 of the adjusting section 160 with the thread groove 222 of the vibrating member 120. However, the adjusting sections 110 and 160 may be attached to the vibrating member 120 using other methods such as interlocking or adhesion.

The drive force transmitting ring 153 is attached to the rotating axle 140 by inserting the drive force transmitting axle 157 into the insertion hole 151 from the side and then inserting the bottom portion of the rotating axle body 144. The rotating axle 140 formed in this way is inserted from above through the through-hole of the vibrating member 120.

The top and bottom ends of the rotating axle body 144 extend outside through the bearing units 114 and 164 of the adjusting sections 110 and 160. The rotating axle body 144 extends further outward on the top side, so that the output gear 170 can be attached on the top end.

The output gear 170 is attached to one end of the rotating axle 140 in the present example. However, by extending the rotating axle body 144 further downward, output gears 170 can be attached to both ends of the rotating axle 140.

The position of the rotating axle body 144 is fixed while allowing for rotation by the bearing units 114 and 164 of the adjusting sections 110 and 160. The bearing units 114 and 164 may be rolling bearings, sliding bearings, or the like. The gap between (i) the bearing units 114 and 164 and (ii) the rotating axle body 144 is small enough to prevent dust from entering the vibrating member 120.

The drive force transmitting ring 153 of the rotating axle 140 contacts the drive surface 121 of the inner surface of the vibrating member 120. In other words, the through-hole of the vibrating member 120 has an inner diameter above the drive surface 121 that is larger than the outer diameter of the drive force transmitting ring 153. Furthermore, the through-hole of the elastic body 120 has an inner diameter below the drive surface 121 that is smaller than the outer diameter of the drive force transmitting ring 153. As a result, the bottom edge of the rotating flange 148 contacts the drive surface 121 to serve as the drive receiving portion 159.

The drive force transmitting ring 153 contacts the rotating flange 148 via the drive force transmitting axle 157. As a result, the rotational drive force from the drive force transmitting ring 153 is transmitted to the rotating axle body 144.

The biasing member 150 is arranged inside the vibrating member 120 and the rotating axle body 144 is inserted therethrough. Here, the top end of the biasing member 150 contacts the bottom surface of the adjusting section 160 and the bottom end of the biasing member 150 contacts the top surface of the rotating flange 148.

The biasing member 150 is arranged in a compressed state between the adjusting section 160 and the rotating flange 148. Accordingly, the biasing member 150 biases the rotating flange 148 downward.

The biased rotating flange 148 is stopped on the drive surface 121 formed by the shoulder portion 118 of the vibrating member 120. In this way, the drive receiving portion 159 of the rotating flange 148 is pressed against the drive surface 121 of the vibrating member 120. With this configuration, a work section 200 can be formed that rotationally drives the rotating axle 140 with the vibration of the vibrating member 120, which is described further below.

The rotating flange 148 rotates as a portion of the rotating axle 140. Therefore, at least one end of the biasing member 150 slides on the components which are contacted thereby. By decreasing the friction of these sliding portions, damage to the vibration actuator 100 due to this movement can be decreased. More specifically, a lubricant may be applied to the sliding portions.

The vibration actuator 100 having the configuration described above operates as described below. In the present embodiment, vibration is supported at both ends from the outside.

As described with reference to FIGS. 8A and 8B, when the drive voltage is applied to the electromechanical transducers 132, 134, 136, and 138 of the drive unit 130, the vibrating member 120 extends longitudinally. When one of the electromechanical transducer elements 132, 134, 136, and 138 expands, the portion of the vibrating member 120 contacting this electromechanical transducer element 132, 134, 136, or 138 also expands, thereby bending the vibrating member 120.

When the drive voltage is applied to the each of the electromechanical transducer elements 132, 134, 136, and 138 sequentially in a direction of the circumference of the vibrating member 120, the curve of the vibrating member 120 sequentially changes. When an AC electric field with a phase sequentially delayed by $\pi/2$ is applied to each of the electromechanical transducer elements 132, 134, 136, and 138, vibration occurs in a circular motion orthogonal to the plane of FIG. 8A.

The vibrating member 120 is supported from the outside at both ends. Therefore, the vibration forms an antinode Y in a direction orthogonal to the plane of FIG. 8A. As a result, the entire vibrating member 120 vibrates with a node Y near the center thereof and antinodes X and Z near the top and bottom ends thereof.

The horizontal movement of the vibrating member 120 during vibration is greatest at the longitudinal center thereof. As a result, through contact with the antinode Y, a large drive force can be transmitted to the drive force transmitting ring 153.

The horizontal movement of the drive surface 121 caused by the vibration of the vibrating member 120 is transmitted to the rotating flange 148 via the slanted drive receiving portion 159. When the horizontal movement is transmitted to the drive receiving portion 159, the drive force transmitting ring 153 moves in the axial direction against the bias of the biasing member 150.

When the drive force transmitting ring 153 moves in the axial direction, a gap occurs between the drive receiving portion 159 and the drive surface 121. Furthermore, since the vibration causes the position at which the drive surface 121 moves to change in the circumferential direction, the friction causing the drive force transmitting ring 153 to rotate occurs between the drive receiving portion 159 and the drive surface 121. The rotation of the rotating flange 148 caused by this friction is transmitted to the outside via the drive force transmitting axle 157, the rotating flange 148, the rotating axle body 144, and the output gear 170, sequentially.

The frequency of the drive voltage applied to the drive unit 130 desirably includes a resonance frequency corresponding to the characteristic frequency of a vibration system including the vibrating member 120. Therefore, the vibrating member is efficiently vibrated by the drive force provided thereto, and this vibration can be continued. The vibrating member 120 may have another vibration mode that uses a plurality of nodes and antinodes.

A drive unit 130 that includes four electromechanical transducer elements 132, 134, 136, and 138 arranged at uniform intervals is used here, but the configuration of the drive unit 130 is not limited to this. The vibrating member 120 can achieve vibration using a drive unit 130 that includes three or more of the electromechanical transducers arranged around the circumference of the vibrating member 120.

In the work section 200, the drive receiving portion 159 and the drive surface 121 repeatedly contact and separate from each other. Accordingly, at least the surfaces of the drive receiving portion 159 and the drive surface 121 can be formed of a material with high abrasion resistance, such as ceramic. As a result, the lifespan of the vibration actuator 100 can be increased.

Figure 13:
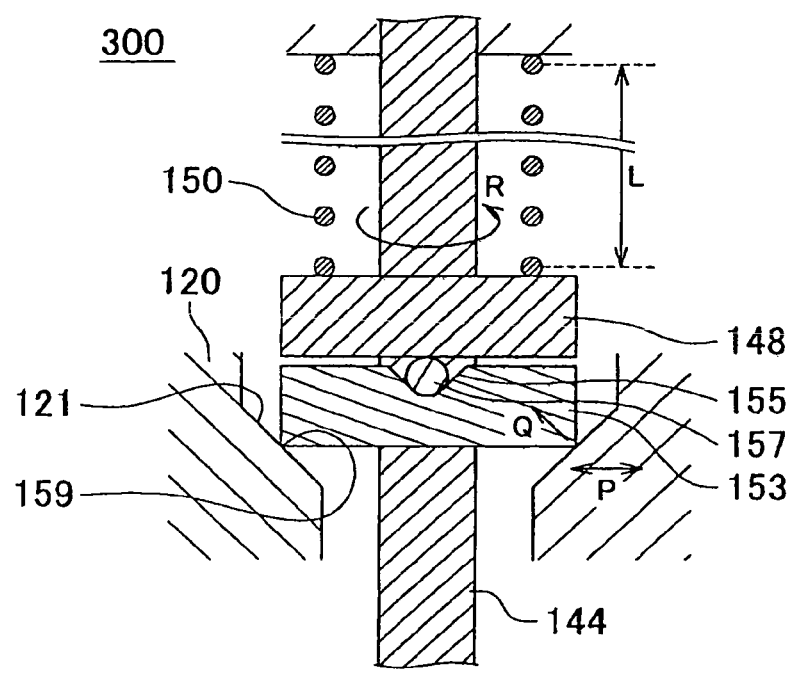
FIG. 13 shows an operation of the vibration actuator 100.

FIGS. 13 and 14 are cross-sectional views of the vibration actuator 100 shown in FIGS. 11 and 12. A converting section 300 includes the drive force transmitting ring 153, the drive force transmitting axle 157, the rotating flange 148, and the biasing member 150.

FIG. 13 shows the vibration actuator 100 operating when the rotational load is small. As described in FIG. 12, the horizontal movement, shown by the arrow P in FIG. 13, of the drive surface 121 caused by the vibration of the vibrating member 120 is transmitted to the rotating flange 148 via the slanted drive receiving portion 159.

When the horizontal movement is transmitted to the drive receiving portion 159, the drive force transmitting ring 153 moves in the axial direction, shown by the arrow Q in FIG. 13, against the bias of the biasing member 150. Furthermore, since the vibration causes the position at which the drive surface 121 moves to change in the circumferential direction, the drive surface 121 causes the drive force transmitting ring 153 to rotate via the drive receiving portion 159. The drive force transmitting axle 157 enters into the transmitting groove 155 formed on the top surface of the drive force transmitting ring 153, and therefore rotates together with the drive force transmitting ring 153.

The rotating flange 148 formed integrally with the rotating axle body 144 is pressed from above by the drive force transmitting axle 157 due to the biasing member 150, and therefore rotates together with the drive force transmitting ring 153. In this way, the rotation of the drive force transmitting ring 153 causes the rotating axle body 144 to rotate, as shown by the arrow R in FIG. 13, with a prescribed drive force.

FIG. 14 shows the vibration actuator 100 operating when the rotational load is large. When the rotational load is large, the rotating flange 148 resists the rotational drive transmitted from the drive force transmitting axle 157, thereby creating a force, shown by the arrow S in FIG. 14, that decreases the speed of the rotation, shown by the arrow R in FIG. 14. This force causes misalignment in the rotational direction between the rotating flange 148 and the drive force transmitting ring 153, and so the rotating flange 148 and the drive force transmitting ring 153 exert forces in different directions on the surface of the drive force transmitting axle 157.

When forces in different directions are exerted on this surface, the drive force transmitting axle 157 rolls and begins climbing the inclined surface of the transmitting groove 155, in the direction shown by the arrow T in FIG. 14, against the bias of the biasing member 150. The position of the drive force transmitting ring 153 is set below the drive surface 121, and so the drive force transmitting axle 157 climbing the transmitting groove 155 pushes the rotating flange 148 upward, in the direction of the arrow U in FIG. 14, thereby compressing the biasing member 150. The compressed biasing member 150 biases the rotating flange 148 downward with an even greater bias force.

The increased bias force exerted on the rotating flange 148 affects the drive force transmitting ring 153 via the drive force transmitting axle 157, and so the force pressing the drive receiving portion 159 against the drive surface 121 also increases. As a result, the drive surface 121 drives the drive force transmitting ring 153 to generate greater rotational torque.

Therefore, when the vibration actuator 100 is starting up such that there is a large rotational load on the vibration actuator 100, the drive force transmitting ring 153 presses strongly on the vibrating member 120, thereby increasing the friction between the drive receiving portion 159 and the drive surface 121 to increase the rotational torque. Furthermore, when the rotating axle 140 achieves consistent rotation such that there is a small rotational load, the bias force described above decreases, and so force pressing the drive force transmitting ring 153 against the vibrating member 120 decreases.

As a result, the vibration actuator 100 can start up smoothly without needing special startup control. Furthermore, since the bias force is low when the load is small, friction between the drive receiving portion 159 and the drive surface 121 is decreased, thereby extending the lifetime of the vibration actuator 100.

Figure 16:
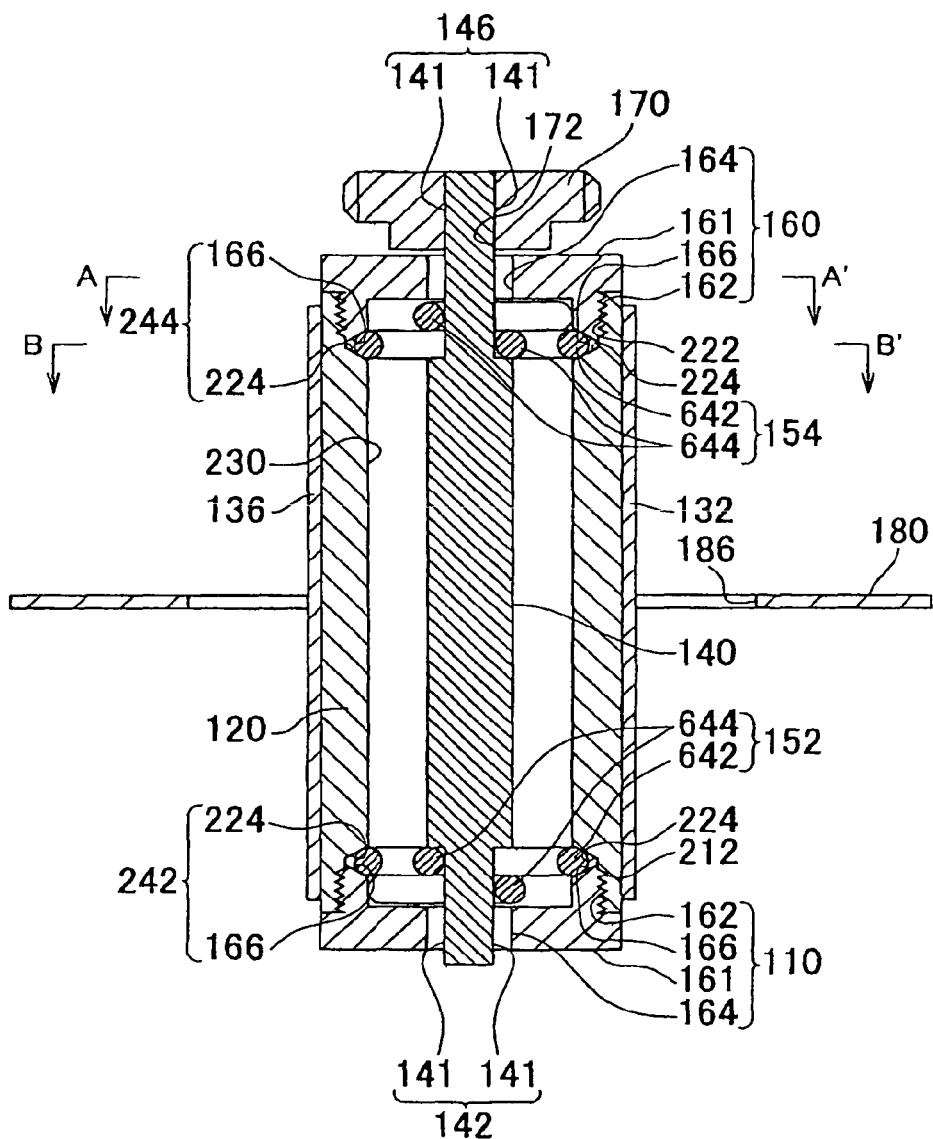
FIG. 16 is a cross-sectional view, in the radial direction, of the vibration actuator 100.

FIG. 15 is an exploded perspective view of a vibration actuator 101. FIG. 16 is a cross-sectional view of the vibration actuator 101 as seen from a radial direction, which is a direction orthogonal to the axial direction of the rotating axle 140. For ease of explanation, the drive output side of the rotating axle 140 in the axial direction is referred to as the "output side," and the opposite side is referred to as the "non-output side."

As shown in FIGS. 15 and 16, the vibration actuator 101 includes the rotating axle 140, the vibrating member 120, the drive unit 130, and the elastic members 152 and 154. The rotating axle 140 rotates to output a moving force. The rotating axle 140 includes non-circular portions 142 and 146 whose diameters differ depending on a position in the circumferential direction.

The vibrating member 120 is arranged on the same axis as the rotating axle 140. The vibrating member 120 is a cylinder with a circular internal circumference. The drive unit 130 causes the vibrating member 120 to vibrate.

The elastic members 152 and 154 contact the rotating axle 140 and the vibrating member 120, and rotate the rotating axle 140 by transmitting the vibrational movement of the vibrating member 120 to the rotating axle 140. The elastic members 152 and 154 are torsion springs coiled along the inner circumference of the vibrating member 120, and each include a pair of grasping portions 644 that cross over each other. Each pair of grasping portions 644 grasps the non-circular portions 142 and 146 using a bias force that presses the grasping portions 644 toward each other. A pair of the elastic members 152 and 154 are arranged at the respective axial ends of the vibrating member 120.

The vibrating member 120 includes V-shaped grooves 242 and 244 along the inner circumference thereof contacting the elastic members 152 and 154. The vibration actuator 101 also includes a holding member 180 that supports, in a fixed state, the vibrating member 120 at an axial center thereof.

The following is a detailed description of the configuration of the vibration actuator 101. As shown in FIGS. 15 and 16, the vibrating member 120 is a rectangular cylinder whose length is along the axial direction of the rotating axle 140, and can be formed of various metals, resins, ceramics, or the like that can be elastically deformed. The vibrating member 120 is hollow, and the rotating axle 140 is inserted therethrough. The vibrating member 120 has a circular inner portion 230 as seen from the axial direction of the rotating axle 140. The vibrating member 120 may have a different shape, such as a circular cylinder.

The rotating axle 140 is a cylinder having the non-circular portion 146 formed on the output side thereof and the non-circular portion 142 formed on the non-output side thereof. The tip of the non-circular portion 146 protrudes to the output side from the vibrating member 120, and the tip of the non-circular portion 142 protrudes to the non-output side from the vibrating member 120.

The output gear 170 is arranged on output side tip of the rotating axle 140. The axle hole 172 is formed in the center of the output gear 170, as a rectangle that can engage with the non-circular portion 146, and the output gear 170 rotates integrally with the non-circular portion 146 when the non-circular portion 146 is engaged with the axle hole 172.

The adjusting section 160 is mounted on the output side end of the vibrating member 120. On this end, the thread groove 222 is formed coaxially with the rotating axle 140. The adjusting section 160 includes the threaded screw portion 162 that is threaded with the thread groove 222 and the flange 161 that is a disc expanding in the radial direction from the output side end of the threaded screw portion 162. The bearing 164 is formed as a circular hole for rotatably supporting the output side of the rotating axle 140, in the center of the threaded screw portion 162 and the flange 161.

The adjusting section 110 is mounted on the non-output side end of the vibrating member 120. On this end, the thread groove 212 is formed coaxially with the rotating axle 140. The adjusting section 110 has the same configuration as the adjusting section 160, such that the threaded screw portion 162 is engaged with the thread groove 212 to rotatably support the output side of the rotating axle 140. In other words, the rotating axle 140 is supported by the vibrating member 120 via the pair of adjusting sections 110 and 160, in a manner to be rotatable on the axis of the vibrating member 120.

The drive unit 130 is arranged on the outer surface of the vibrating member 120. The drive unit 130 includes a plurality (four in the present embodiment) of electromechanical transducers 132, 134, 136, and 138 arranged along the circumferential direction of the rotating axle 140. The electromechanical transducers 132, 134, 136, and 138 are rectangular boards whose lengths are oriented in the axial direction of the rotating axle 140, and each electromechanical transducer is mounted on one of the four outer surfaces of the vibrating member 120 via adhesion or the like. The electromechanical transducers 132, 134, 136, and 138 include electrodes, not shown. Drive voltage is applied to the electromechanical transducers 132, 134, 136, and 138 from a power source, not shown, via the electrodes.

The electromechanical transducer elements 132, 134, 136, and 138 include piezoelectric materials that expand when a drive voltage is applied thereto. Examples of such piezoelectric materials include titanate, lead zirconate titanate, crystal, lithium niobate, barium titanate, lead titanate, lead metaniobate, polyvinylidene difluoride, lead zinc niobate, lead scandium niobate, and the like.

Many piezoelectric materials are fragile, and so these materials are desirably reinforced with a highly elastic metal such as phosphor bronze. Instead, the vibrating member 120 itself may serve as a support structure and the electromechanical transducer elements 132, 134, 136, and 138 may be formed by creating a piezoelectric material layer on the surface of the vibrating member 120. The electrodes mentioned above may be made of nickel, gold, or the like and formed directly on the surface of the piezoelectric plates using techniques such as plating, sputtering, vapor deposition, or thin film printing. The holding member 180 is mounted on an axially central region of the outer surface of the vibrating member 120. The holding member 180 is shaped as a disc arranged coaxially with the rotating axle 140, and includes a rectangular aperture 186 through which the vibrating member 120 is inserted and mounting holes 184 through which screws or the like are inserted.

Here, the distance between corners of the vibrating member 120 are set to be slightly longer than a side of the aperture 186, and the vibrating member 120 engages with the aperture 186 when the corners of the vibrating member 120 contact the midpoints of the edges of the aperture 186. Furthermore, notches 102 that can engage with the midpoints of the edges of the aperture 186 are formed at the axial center of the corners of the vibrating member 120.

Therefore, by inserting the vibrating member 120 into the aperture 186 and then rotating the vibrating member 120 on its axis and engaging the four notches 102 with the midpoints of the four sides of the aperture 186, the vibrating member 120 can be integrated with the holding member 180 while having its rotational position locked. The holding member 180 can be mounted on a drive receiving apparatus using the vibration actuator 101 as a driving source, using screws or the like inserted though the mounting holes 184.

The elastic members 154 and 152 are respectively arranged at the non-circular portions 146 and 142. The elastic members 154 and 152 are torsion springs having the same shape and dimensions, and are respectively mounted on the bases of the non-circular portions 146 and 142. The elastic members 154 and 152 each include a circular portion 642 and a pair of grasping portions 644.

The circular portions 642 are formed by coiling elastic wire material along the inner portion 230. The grasping portions 644 are formed by bending the ends of the wire material inward. The ends of each circular portion 642 overlap vertically, and each pair of grasping portions 644 are horizontally symmetrical with respect to the center of the circular portion 642.

At the axial ends of the inner portion 230 of the vibrating member 120, inclined surfaces 224 are formed that are inclined to approach the ends of the rotating member 120 as they move radially outward, and inclined surfaces 166 are formed that are inclined to approach the tips of the threaded screw portions 162 as they move radially outward. The inclined surfaces 224 and 166 face each other in the axial direction of the rotating axle 140 in a manner to form the V-shaped grooves 244 and 242, and the circular portions 642 of the elastic members 154 and 152 are inserted in the V-shaped groove 244.

Figure 17:
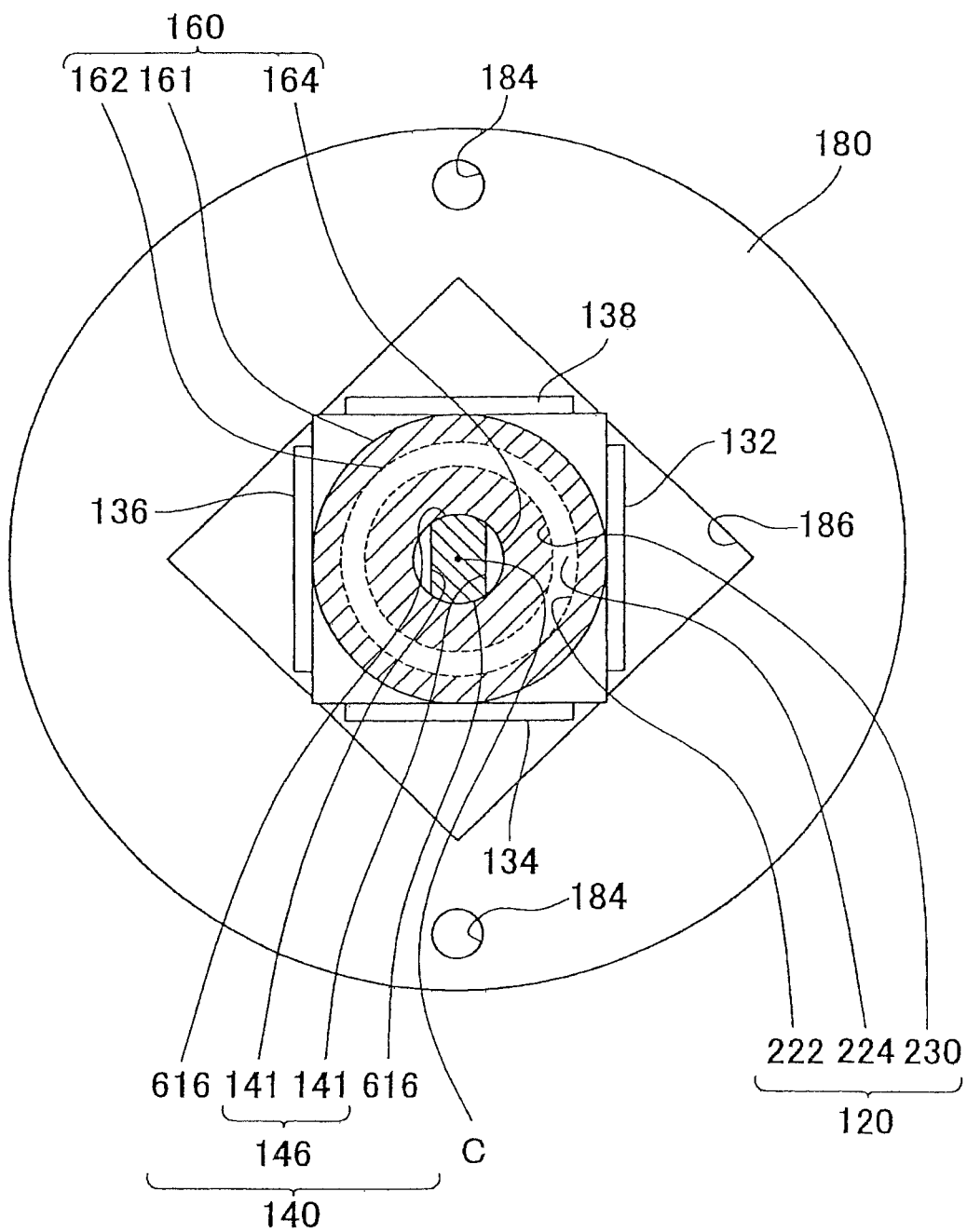
FIG. 17 is a cross-sectional view taken along the line A-A' of FIG. 16.

FIG. 17 is a cross-sectional view taken along the line A-A' of FIG. 16. As shown in FIG. 17, a pair of arc-like portions 616 that are symmetrical with respect to the axis C are formed on the output side of the rotating axle 140. This pair of arc-like portions 616 engage with the bearing 164 in a mariner to allow rotation. The structure for the support on the non-output side of the rotating axle 140 by the adjusting section 110 is the same as the structure for the support on the output side of the rotating axle 140 by the adjusting section 160, and therefore a description is omitted.

Figure 18:
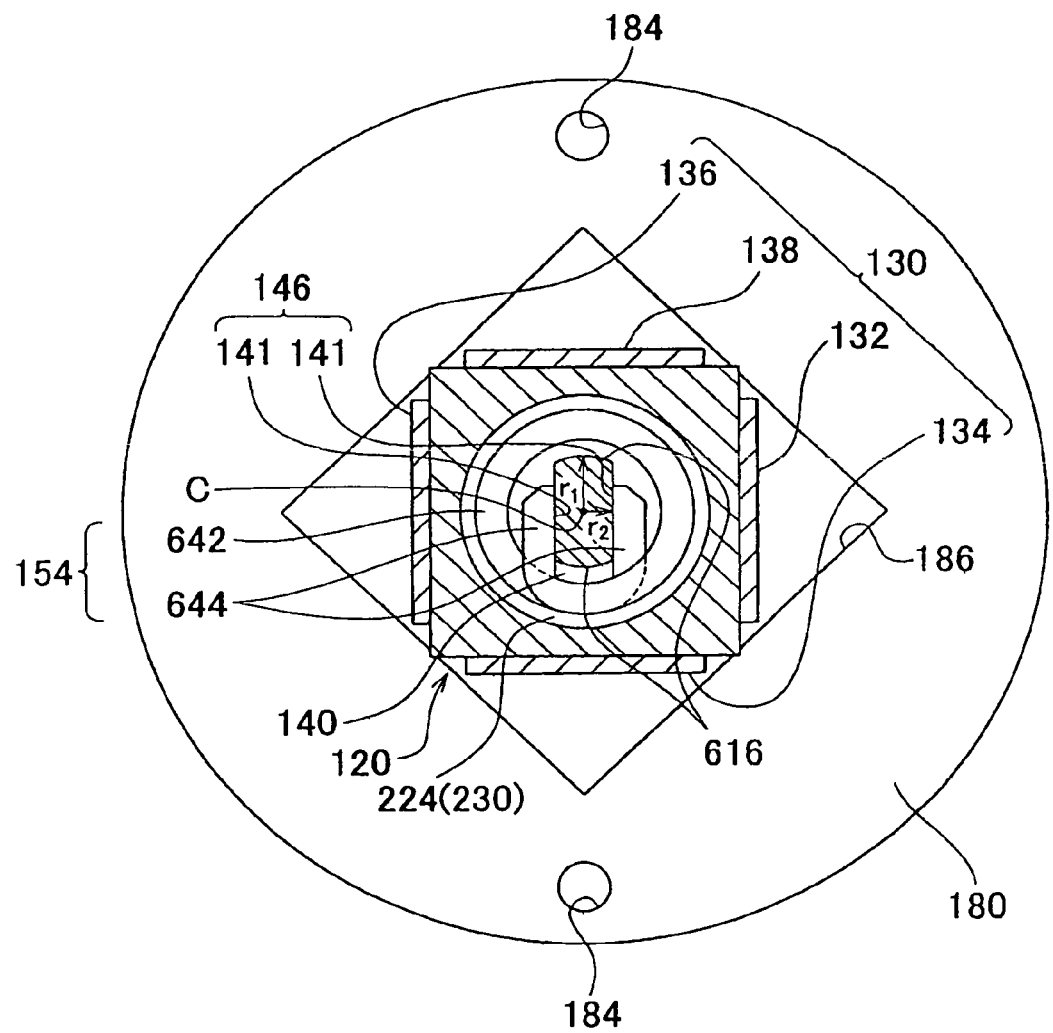
FIG. 18 is a cross-sectional view taken along the line B-B' of FIG. 16.

FIG. 18 is a cross-sectional view taken along the line B-B' of FIG. 16. As shown in FIG. 18, the non-circular portion 146 includes a pair of flat surfaces 141 that are horizontally symmetric with respect to the axis C. The flat surfaces 141 are formed to be recessed radially inward relative to the circumference of the rotating axle 140. In other words, the radius $r_2$ from the axis C to a flat surface 141 is less than the radius $r_1$ of the rotating axle 140. The interval between the grasping portions 611 in a pair is less than a thickness $2 \times r_2$ of the non-circular portion 146 when the elastic member 154 has no rotational load, and the non-circular portion 146 is sandwiched between the pair of grasping portions 644 when the circular portion 642 is elastically deformed.

Here, various parameters such as the interval between each grasping portion 644 in a pair, elastic constants of the elastic members 154 and 152, and diameters of the elastic members 154 and 152 are set such that, when the rotating axle 140 is rotated with a torque greater than a reference amount, the elastic members 154 and 152 are elastically deformed. The configuration for mounting the non-circular portion 142 and the elastic member 152 is the same as the configuration for mounting the non-circular portion 146 and the elastic member 154, and therefore further explanation is omitted.

Figure 19:
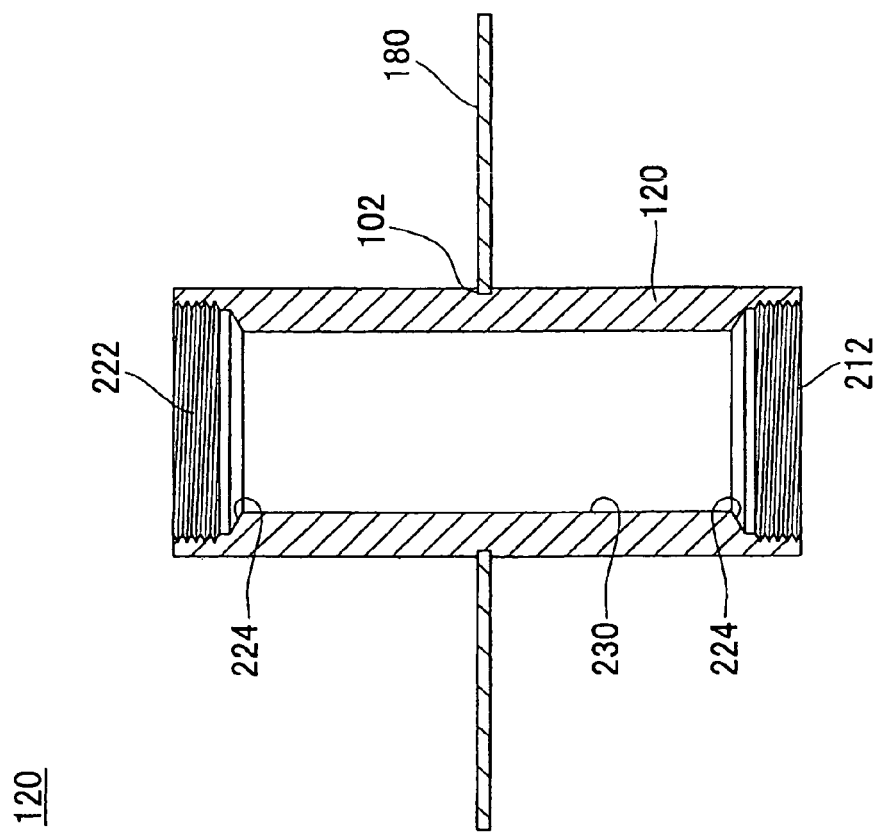
FIG. 19A is a cross-sectional view, in the radial direction, of the vibrating member 120.
FIG. 19B is a schematic diagram showing the vibrational movement of the vibrating member 120.

The following describes the operation of the present embodiment. FIGS. 19A and 19B are schematic diagrams showing the vibrational movement of the vibrating member 120 according to the drive state of the vibration actuator 101. When the vibration actuator 101 is in a drive state, an AC voltage with a phase sequentially delayed by π/2 is applied to the electromechanical transducers 132, 134, 136, and 138.

Here, the electromechanical transducers 132 and 136, which are arranged symmetrically to each other with respect to the axis of the rotating axle 140, and the electromechanical transducers 134 and 138, which are also arranged symmetrically to each other with respect to the axis of the rotating axle 140, each have applied thereto a drive voltage with the same phase and with a sign that differs for each electromechanical transducer in a symmetric pair. As a result, the electromechanical transducers 132 and 136 alternate between a state in which one extends while the other contracts and a state in which the one contracts while the other extends. Similarly, the electromechanical transducers 134 and 138 alternate between a state in which one extends while the other contracts and a state in which the one contracts while the other extends.

The vibrating member 120 is held in a fixed manner at the axial center thereof by the holding member 180. Therefore, the axial ends of the vibrating member 120 alternate between bending in the direction of the electromechanical transducer 132 and bending in the direction of the electromechanical transducer 136, and also alternate between bending in the direction of the electromechanical transducer 134 and bending in the direction of the electromechanical transducer 138.

By sequentially delaying the phase of the drive voltage applied to the electromechanical transducers 132, 134, 136, and 138 by $\pi/2$, the bending direction of the ends of the vibrating member 120 shifts in the direction of rotation of the rotating axle 140. Therefore, as shown in FIG. 19B, the axial ends of the vibrating member 120 move in circles centered on the axis of the rotating axle 140. In other words, the entire vibrating member 120 vibrates with antinodes X at the axial ends thereof and a node Y at the axial center thereof. The vibration of the vibrating member 120 is transmitted to the rotating axle 140 via the elastic members 152 and 154, so that the rotating axle 140 rotates to output a motor drive force via the output gear 170.

FIG. 20 is a cross section taken along the line B-B' of FIG. 16 in a state where torque greater than a reference amount is applied to the rotating axle 140 from the outside, which may occur when the rotating axle 140 is forced to rotate excessively from the outside. The operations performed at the output side and the non-output side are the same, and so the output side operation will be described as an example while a description of the non-output side operation is omitted.

As shown in FIG. 20, when torque greater than the reference amount is applied to the rotating axle 140 from the outside, the rotating axle 140 rotates relative to the elastic member 154, and as a result, the pair of flat surfaces 141 cause the pair of grasping portions 644 to move away from each other, in the direction of the arrow R in FIG. 20, against the elastic bias force of the circular portion 642. Therefore, as shown by the arrow S in FIG. 20, the radius of the circular portion 642 of the elastic member 154 decreases, and so the contact force between the circular portion 642 and the V-shaped groove 244 also decreases.

Accordingly, when the rotating axle 140 is excessively rotated from the outside, first, the rotating axle 140 rotates relative to the elastic member 154 to create a state in which the contact force between the circular portion 642 and the V-shaped groove 244 is decreased or the circular portion 642 is moved away from the V-shaped groove 244. After this, the elastic member 154 begins rotating along with the rotating axle 140, which results in sliding while rotating or rotation without a load. After the rotational load of the rotating axle 140 drops below the reference amount, the responsive elastic force of the elastic member 154 causes the radius of the circular portion 642 to increase, thereby causing the contact force exerted on the V-shaped groove 244 to be high once again.

In other words, when a rotational load greater than a reference amount is applied to the rotating axle 140, the elastic member 154 decreases the contact force on the vibrating member 120. As a result, when a rotational load greater than a reference amount is applied to the rotating axle 140, the friction between the elastic member 154 and the vibrating member 120 can be decreased, thereby reducing wear on the elastic member 154 and the vibrating member 120.

Accordingly, the integrity of the contact portions of the elastic member 154 and the vibrating member 120 can be maintained, and so the resulting vibration actuator 101 has an extended lifetime. When the drive of the vibration actuator 101 is stopped, the circular portion 642 of the elastic member 154 contacts the V-shaped groove 244 with a prescribed contact force, and so the rotating axle 140 can be stopped, i.e. self-supported, at a prescribed position.

In the present embodiment, the elastic members 154 and 152 are arranged at the ends of the rotating axle 140, which are positions corresponding to the antinodes X of the vibration of the rotating axle 140, and so the vibration of the vibrating member 120 can be efficiently transmitted to the elastic member 154 to efficiently increase the motor output. Furthermore, in the present embodiment, the V-shaped groove 244 contacting the circular portion 642 of the elastic member 154 is formed in the inner portion 230, so that the elastic member 154 can lock the axial position of the rotating axle 140, and so a simpler structure and lower cost can be achieved because a biasing member or the like for contacting the elastic member 154 on the inner portion 230 is unnecessary.

In the present embodiment, by moving the adjusting sections 160 and 110 in the axial direction of the rotating axle 140, one of the pair of inclined surfaces 166 and 224 facing each other in the V-shaped grooves 244 and 242 can be brought closer to and moved away from the other. As a result, the radial position at which the elastic members 154 and 152 contact the inclined surfaces 166 and 224 can be adjusted, and the contact force between the elastic member 154 and the vibrating member 120 can be adjusted.

Figure 21:
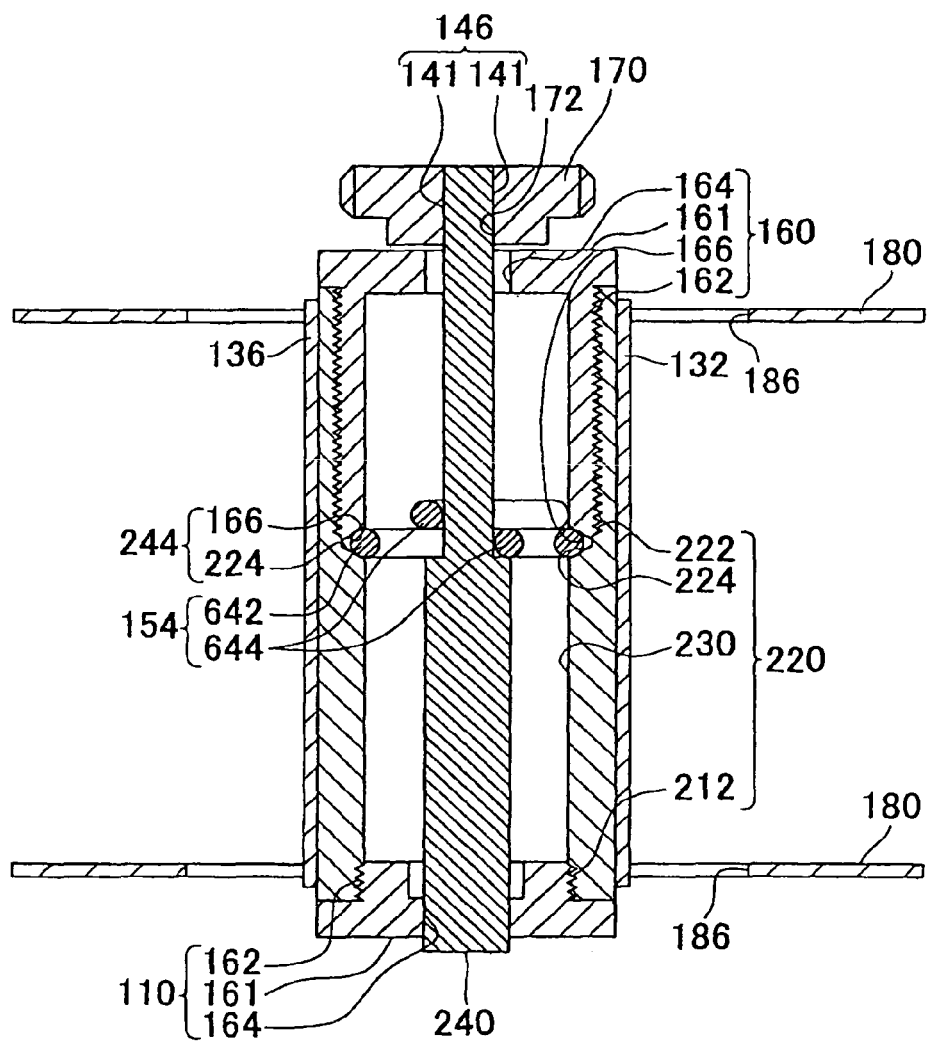
FIG. 21 is a cross-sectional view, in the radial direction, of the vibration actuator 801.

The following describes a vibration actuator 801 according to another embodiment of the present invention. Components that are the same as those in other embodiments are given the same reference numerals, and redundant descriptions are omitted. FIG. 21 is a cross-sectional view of the vibration actuator 801 of the present embodiment as seen in the radial direction.

As shown in FIG. 21, in the vibration actuator 801, the V-shaped groove 244 is arranged in the axial center of the rotating axle 240. Furthermore, the non-circular portion 146 is formed to extend from an axial end on the output side of the rotating axle 240 to a central region thereof, and the elastic member 154 is arranged in the axial center of the rotating axle 240. The pair of holding members 180 hold the rotating axle 240 at the axial center thereof in a fixed manner.

Figure 22:
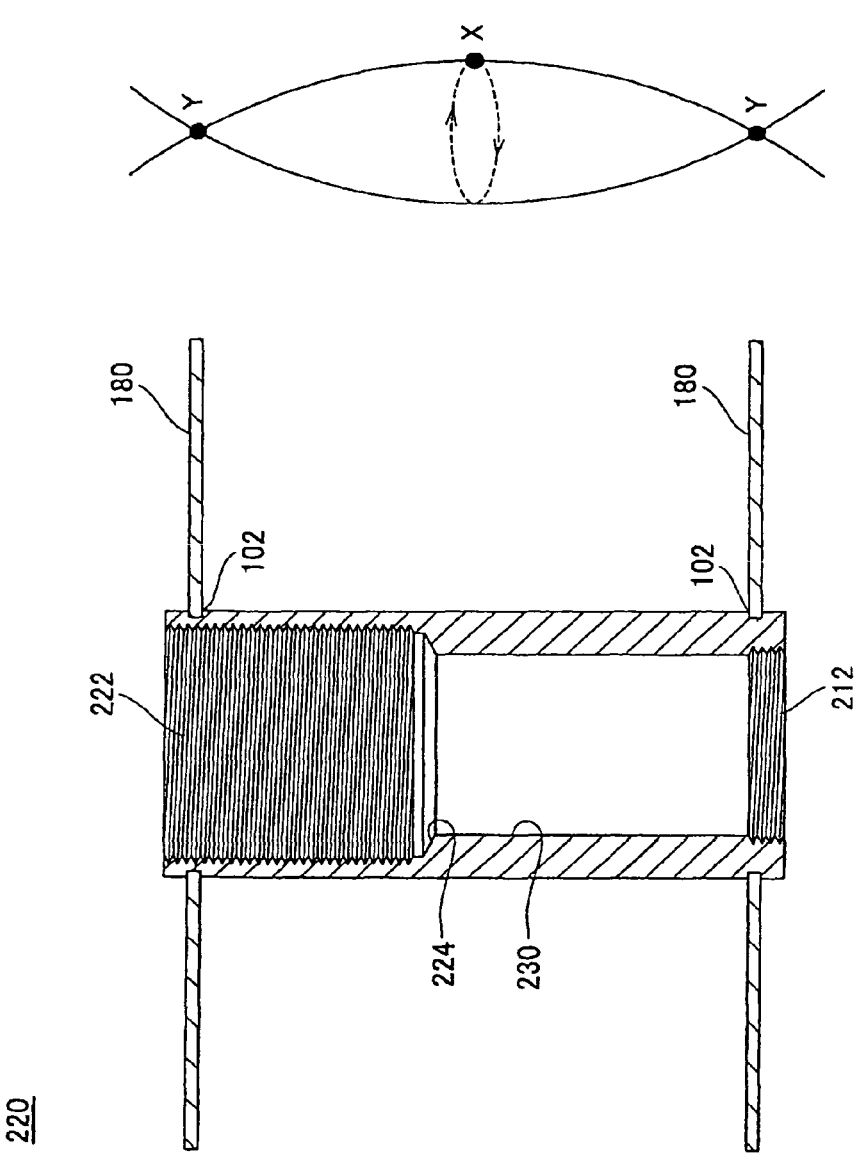
FIG. 22A is a cross-sectional view, in the radial direction, of the vibrating member 120.
FIG. 22B is a schematic diagram showing the vibrational movement of the vibrating member 120.

The following describes the operation of the present embodiment. FIGS. 22A and 22B are schematic diagrams showing the vibrational movement of the vibrating member 120 according to the drive state of the vibration actuator 801. When the vibration actuator 801 is driving, the electromechanical transducers 132, 134, 136, and 138 are driven in the same manner as in the other embodiments. Here, the axial ends of the vibrating member 220 are held in a fixed manner by the pair of holding members 180, and so the entire vibrating member 220 vibrates with an antinode X in the axial center thereof and nodes Y at the axial ends thereof. The vibration of the vibrating member 220 is transmitted to the rotating axle 240 via the elastic member 154, so that the rotating axle 240 rotates to output a motor drive force via the output gear 170.

In the present embodiment, the elastic member 154 is arranged at the axial center of the rotating axle 240, which is a position corresponding to the vibration antinode X of the rotating axle 240. Therefore, the vibration can be efficiently transmitted from the vibrating member 220 to the elastic member 154 to efficiently increase the motor output.

Figure 23:
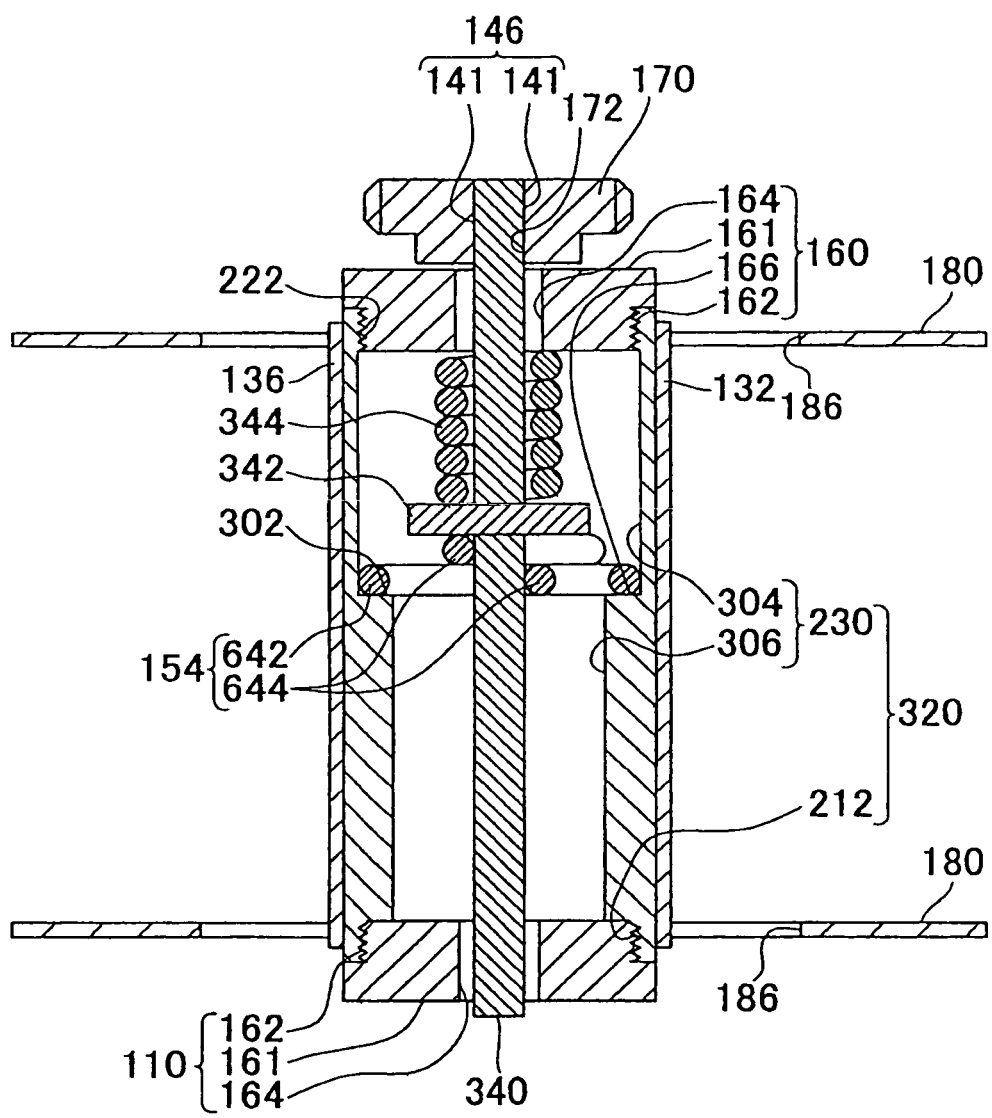
FIG. 23 is a cross-sectional view, in the radial direction, of the vibration actuator 802.

The following is a detailed description of the vibration actuator 802. Components that are the same as those in other embodiments are given the same reference numerals, and redundant descriptions are omitted. FIG. 23 is a cross-sectional view of the vibration actuator 802 of the present embodiment as seen in the radial direction. As shown in FIG. 23, in the vibration actuator 802, a stepped portion 302 is formed at the axial center of the vibrating member 320, and the inner portion 230 is divided into an expanded diameter portion 304 on the output side and a contracted diameter portion 306 on the non-output side, with a boundary defined by the stepped portion 302.

The elastic member 154 is arranged in the expanded diameter portion 304' and contacts the stepped portion 302. A disc-shaped flange 342 that expands radially outward is formed at the axial center of the rotating axle 340. An elastic member 344 is arranged between the flange 342 and the adjusting section 160. The elastic member 344 is a compression coil spring that can be elastically compressed in the axial direction of the rotating axle 340, and presses the elastic member 154 toward the stepped portion 302 via the flange 342 by biasing the flange 342 toward the non-output side. As a result, the position of the elastic member 154 is locked at the axial center of the vibrating member 320.

The vibration of the vibrating member 320 is applied to the elastic member 154 from the sides and from below, and so the vibration applied to the rotating axle 340 can be efficiently increased, thereby efficiently increasing the output of the vibration actuator 802.

Figure 24:
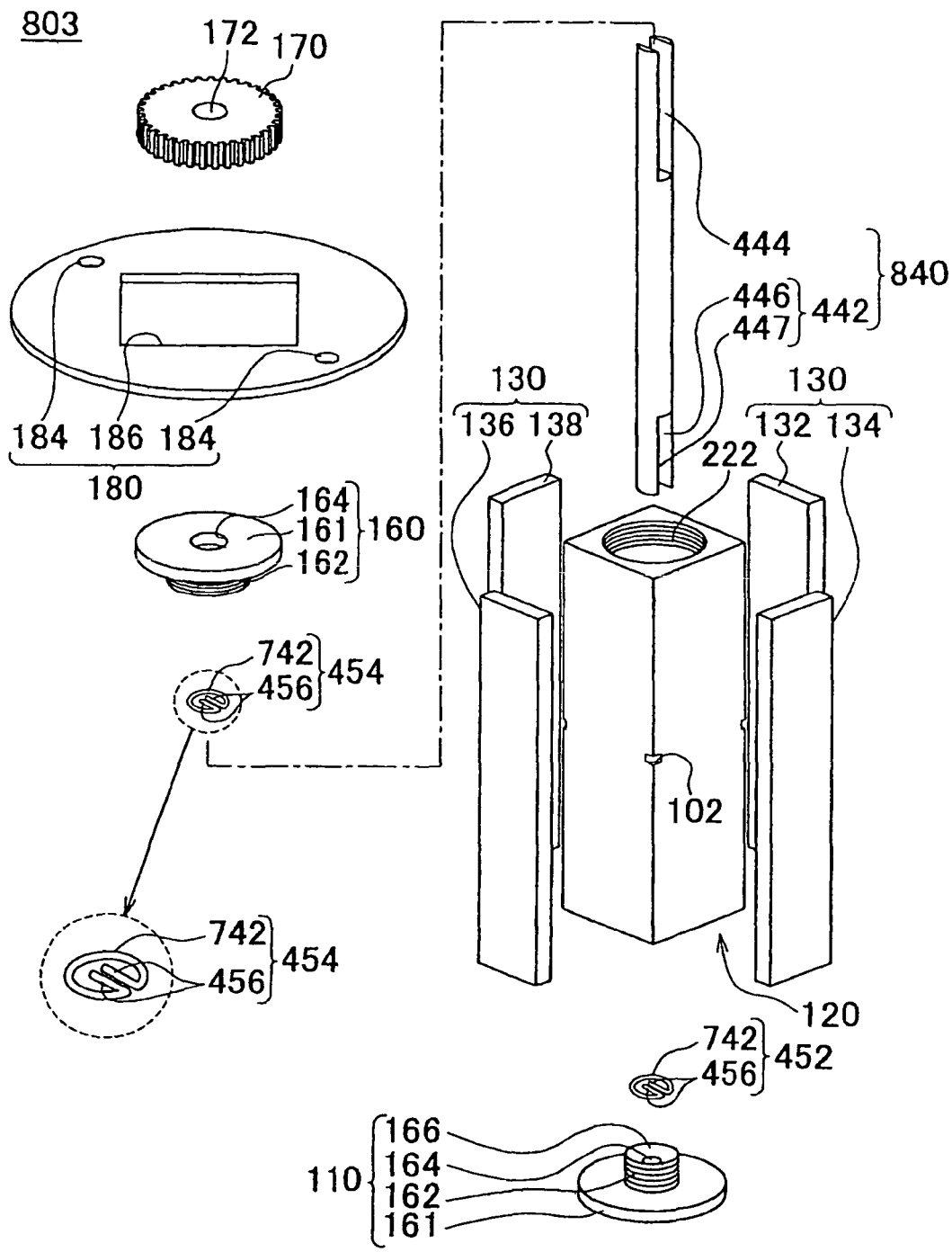
FIG. 24 is an exploded perspective view of a vibration actuator 803.
Figure 25:
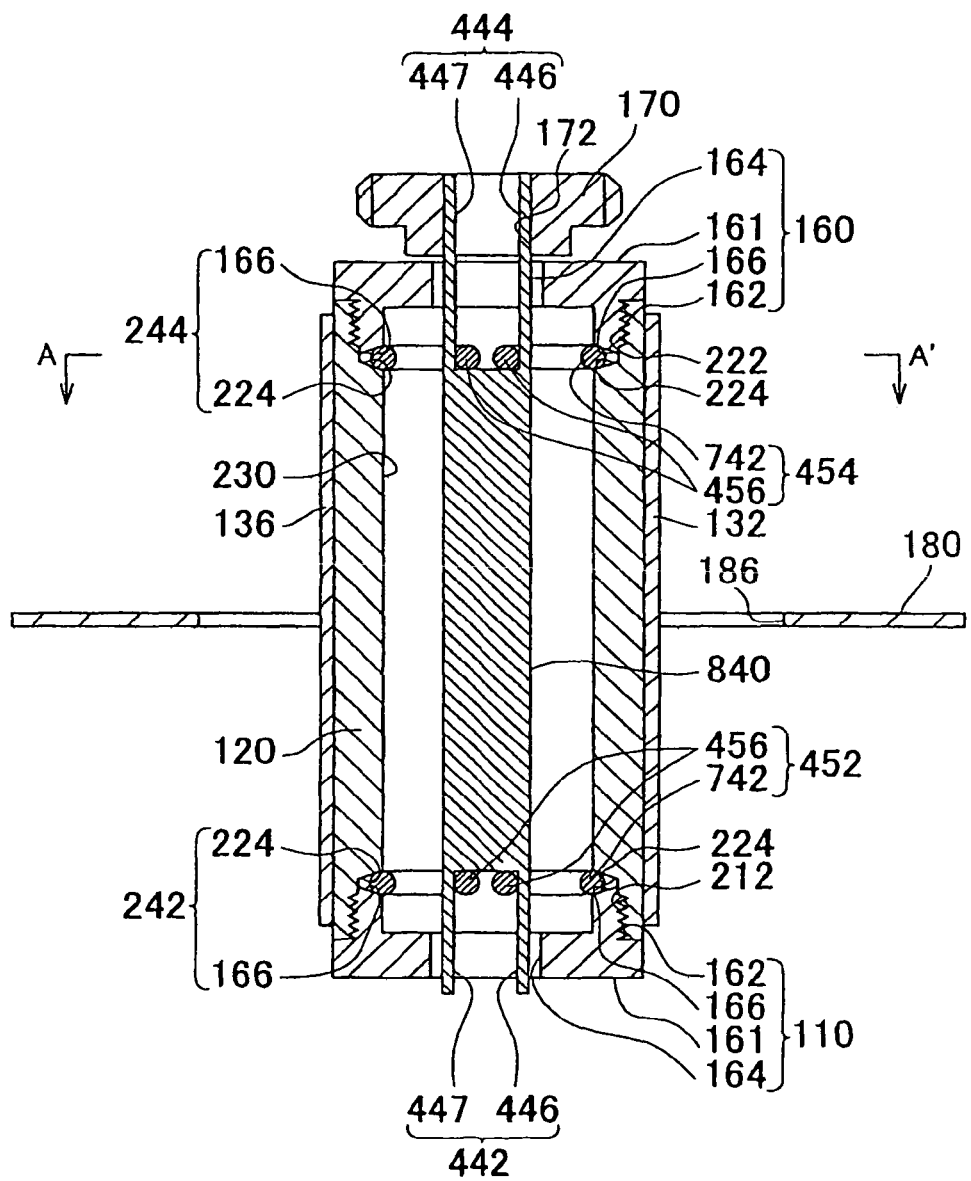
FIG. 25 is a cross-sectional view, in the radial direction, of the vibration actuator 803.

The following describes another embodiment. Components that are the same as those in other embodiments are given the same reference numerals, and redundant descriptions are omitted. FIG. 24 is an exploded perspective view of the vibration actuator 803 of the present embodiment. FIG. 25 is a cross-sectional view of the vibration actuator 803 as seen in the radial direction.

As shown in FIGS. 24 and 25, the vibration actuator 803 includes the vibrating member 120, a rotating axle 840, and a pair of engaging sections 456. The vibrating member 120 is a cylinder with a circular inner portion 230. The rotating axle 840 includes portions being engaged 442 and 444 as recessed portions that are recessed in the axial direction. The pair of engaging sections 456 are coiled along the inner circumference of the vibrating member 120, and are formed as torsion springs having a pair of engaging sections 456 that engage with the side walls 446 and 447 of the portions being engaged 442 and 444 by being biased in a direction to move away from each other at the ends thereof.

The portions being engaged 444 and 442 that include inwardly recessed portions passing therethrough are respectively formed at the output side and the non-output side of the rotating axle 840. The side walls 446 and 447 of the portions being engaged 444 and 442 are flat surfaces that are horizontally symmetrical with respect to the axis C of the rotating axle 840. The portion being engaged 444 extends to a radial position of the V-shaped groove 244, and the portion being engaged 442 extends to a radial position of the V-shaped groove 242.

The elastic members 454 and 452 are respectively arranged at the portions being engaged 444 and 442. The elastic members 452 and 454 are torsion springs having the same shape and dimensions, and are respectively mounted on the bottoms of the portions being engaged 444 and 442.

Figure 26:
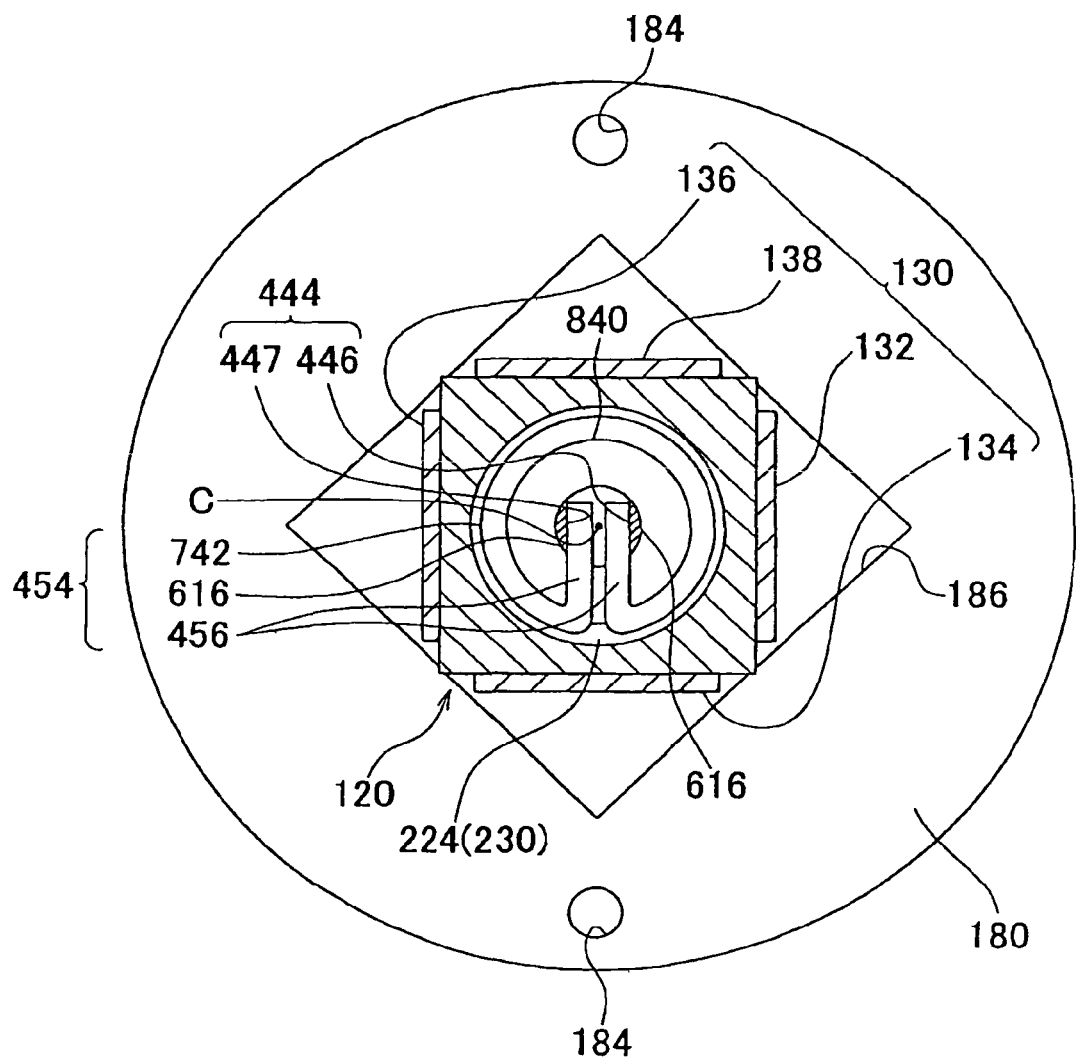
FIG. 26 is a cross-sectional view taken along the line A-A' of FIG. 25.

FIG. 26 is a cross-sectional view taken along the line A-A' of FIG. 25. As shown in FIG. 26, the elastic members 454 and 452 each include a circular portion 742 and a pair of engaging sections 456. The circular portion 742 is formed by coiling an elastic wire material along the inner portion 230. The engaging sections 456 are formed by bending the ends of the wire material inward, and are sandwiched by the V-shaped grooves 244 and 242. The ends of each circular portion 742 are distanced from each other in the circumferential direction, and each pair of engaging sections 456 are horizontally symmetrical with respect to the center of the circular portion 742.

The interval between each engaging section 456 in a pair is greater than the interval between each pair of side walls 446 and 447 when there is no load placed on the elastic member 454. In other words, each pair of side walls 446 and 447 sandwiches a pair of engaging sections 456 when the circular portion 742 is elastically deformed. Here, various parameters such as the interval between each engaging section 456 in a pair, elastic constants of the elastic members 454 and 452, and diameters of the elastic members 454 and 452 are set such that, when the rotating axle 840 is rotated with a torque greater than a reference amount, the elastic members 454 and 452 are elastically deformed. The configuration for mounting the portion being engaged 442 and the elastic member 452 is the same as the configuration for mounting the portion being engaged 444 and the elastic member 454, and therefore further explanation is omitted.

Figure 27:
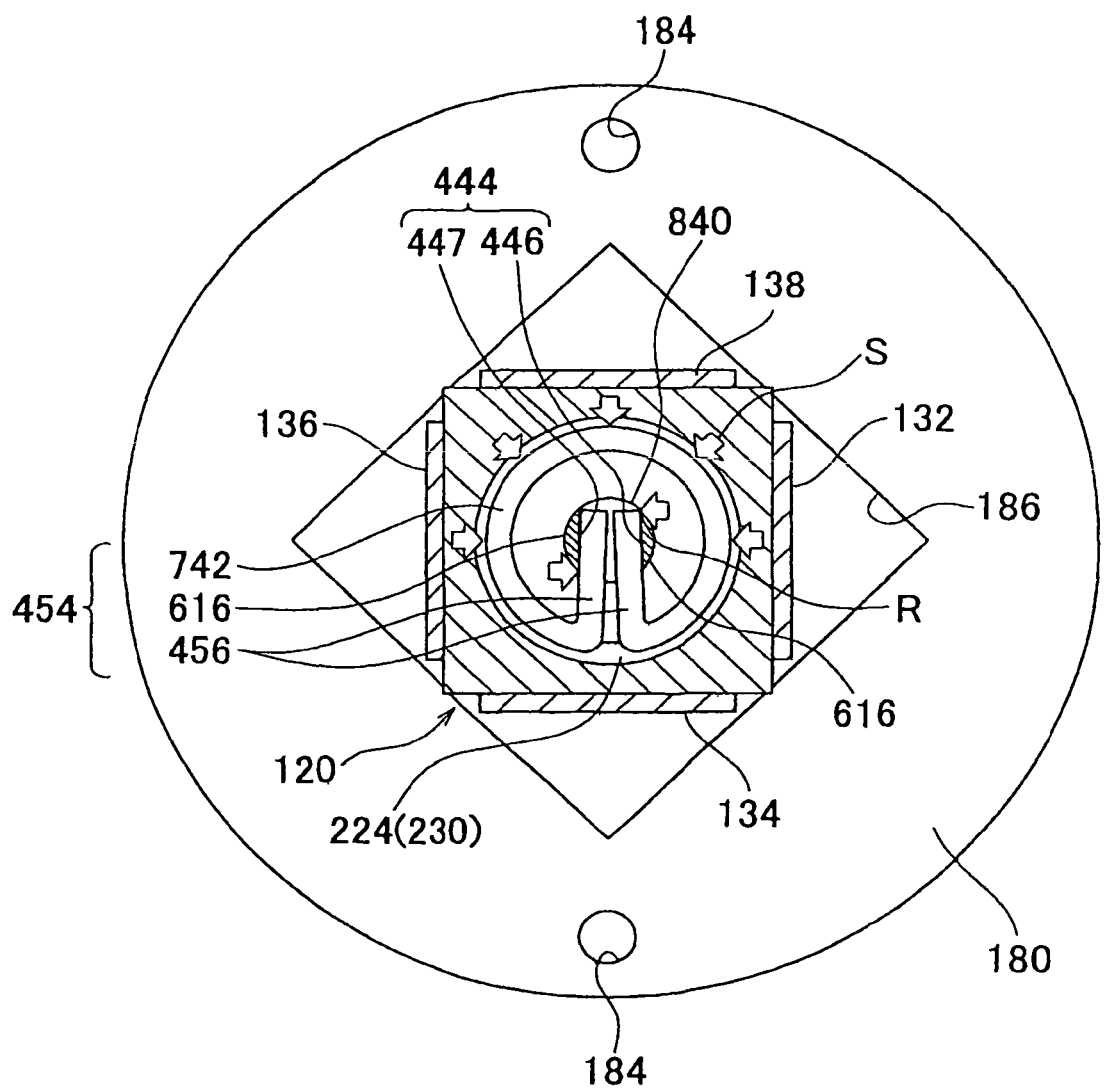
FIG. 27 is a cross section taken along the line A-A' of FIG. 26 in a state where torque greater than a reference amount is applied to the rotating axle 840.

The following describes the operation of the present embodiment. FIG. 27 is a cross section taken along the line A-A' of FIG. 25 in a state where torque greater than a reference amount is applied to the rotating axle 840 from the outside. The operations performed at the output side and the non-output side are the same, and so the output side operation will be described as an example while a description of the non-output side operation is omitted.

As shown in FIG. 27, when torque greater than the reference amount is applied to the rotating axle 840 from the outside, the rotating axle 840 rotates relative to the elastic member 454, and the pair of side walls 446 cause the pair of engaging sections 456 to move toward each other against the elastic bias force of the circular portion 742. Therefore, the radius of the circular portion 742 of the elastic member 454 decreases, and so the contact force between the circular portion 742 and the V-shaped groove 244 also decreases.

In other words, when a rotational load greater than a reference amount is applied to the rotating axle 840, the elastic member 454 decreases the contact force on the vibrating member 120. As a result, when a rotational load greater than a reference amount is applied to the rotating axle 840, the friction between the elastic member 454 and the vibrating member 120 can be decreased, thereby protecting the contact portions of the elastic member 454 and the vibrating member 120. In the present embodiment, when the drive of the vibration actuator 803 is stopped, the circular portion 742 of the elastic member 454 contacts the V-shaped groove 244 with a prescribed contact force, and so the rotating axle 840 can be stopped, i.e. self-supported, at a prescribed position.

In the present embodiment, the portions being engaged 442 and 444 are formed as slits that split the rotating axle 840 at the output side and the non-output side. However, the portions being engaged 442 and 444 may instead each have a pair of side walls that engage with the pairs of engaging sections 456 due to the elasticity of the engaging sections 456, and may be rectangular through-holes or recesses.

FIG. 28 is a schematic view of a vertical cross-sectional of an image capturing apparatus 400 including the vibration actuator 700. The image capturing apparatus 400 includes a lens unit 410 and a body 460. The lens unit 410 is provided to be attachable to and detachable from the body 460, via a mount 450. The lens unit 410 includes an optical component 420, a lens barrel 430 that houses the optical component 420, and a vibration actuator 700 that is provided in the lens barrel 430 and drives the optical component 420.

The optical component 420 includes a front lens 422, a compensator lens 424, a focusing lens 426, and a main lens 428 arranged in the stated order from the left side of FIG. 26, which is the end at which light enters. An iris unit 440 is arranged between the focusing lens 426 and the main lens 428.

The vibration actuator 700 is fixed to an inner portion of the lens barrel 430 via the holding members 180 and 190 using fixing components such as screws. Therefore, the holding members 180 and 190 support the vibrating member 720 at a position near the node of the vibrational movement of the vibrating member 720. As a result, the vibration of the vibrating member 720 is not transmitted to the lens barrel 430, and so the effect of the vibration of the vibrating member 720 on the image capturing apparatus 400 can be decreased.

The vibration actuator 700 is arranged below the focusing lens 426 with a relatively small diameter in the approximate center of the lens barrel 430 in the direction of the optical axis. As a result, the vibration actuator 700 can be housed in the lens barrel 430 without increasing the diameter of the lens barrel 430. The vibration actuator 700 may cause the focusing lens 426 to move forward or backward along a track in the direction of the optical axis, for example.

The body 460 houses an optical component that includes a main mirror 540, a pentaprism 470, and an eyepiece system 490. The main mirror 540 moves between a standby position, in which the main mirror 540 is arranged diagonally in the optical path of the light incident through the lens unit 410, and an image capturing position, shown by the dotted line in FIG. 28, in which the main mirror 540 is raised above the optical path of the incident light.

When in the standby position, the main mirror 540 guides the majority of the incident light toward the pentaprism 470 arranged thereabove. The pentaprism 470 projects the reflection of the incident light toward the eyepiece system 490, and so the image on the focusing screen 472 can be seen correctly from the eyepiece system 490. The remaining incident light is guided to the light measuring unit 480 by the pentaprism 470. The light measuring unit 480 measures the intensity of this incident light, as well as a distribution or the like of this intensity.

A half mirror 492 that superimposes the display image formed by the finder liquid crystal 494 onto the image of the focusing screen 472 is arranged between the pentaprism 470 and the eyepiece system 490. The display image is displayed superimposed on the image projected from the pentaprism 470.

The main mirror 540 has a sub-mirror 542 formed on the back side of the surface facing the incident light. The sub-mirror 542 guides a portion of the incident light passed through the main mirror 540 to the distance measuring unit 530 arranged therebelow. Therefore, when the main mirror 540 is in the standby position, the distance measuring unit 530 can measure the distance to the subject. When the main mirror 540 moves to the image capturing position, the sub-mirror 542 is also raised above the optical path of the incident light.

A shutter 520, an optical filter 510, and an image capturing section 500 are arranged to the rear of the main mirror 540 in the stated order. When the shutter 520 is open, the main mirror 540 arranged immediately in front of the shutter 520 moves to the image capturing position, and so the incident light travels to the image capturing section 500. As a result, the image formed by the incident light can be converted into an electric signal. As a result, the image capturing section 500 can capture the image formed by the lens unit 410.

In the image capturing apparatus 400, the lens unit 410 and the body 460 are electrically connected to each other. Therefore, an autofocus mechanism can be formed by controlling the rotation of the vibration actuator 700 while referencing the information concerning the distance to the subject detected by the distance measuring unit 530 in the body 460, for example. As another example, a focus aid mechanism can be formed by the distance measuring unit 530 referencing the movement amount of the vibration actuator 700. The vibration actuator 700 and the image capturing section 500 are controlled by the control section 550 in the manner described above.

The above describes a case in which the focusing lens 426 is driven by the vibration actuator 700, but the vibration actuator 700 may instead drive opening and closing of the iris unit 440, movement of the variator lens in a zoom lens, or the like. In such a case, by exchanging information with the light measuring unit 480 and the finder liquid crystal 494 in the form of electric signals, the vibration actuator 700 can achieve automatic exposure, scene mode execution, bracket image capturing, or the like.

The above describes a case in which the vibration actuator 700 is included, but it goes without saying that the vibration actuator 100 can be used instead of the vibration actuator 700. The vibration actuators 100 and 700 automatically increase the rotational torque when the rotational load is large, and therefore the control of the vibration actuators 100 and 700 is simplified. Furthermore, stable performance can be achieved even when the load changes.

Instead of the vibration actuator 100, any of the vibration actuators 101, 801, 802, and 803 can be used. In this case, the vibration actuator 101, 801, 802, or 803 automatically decreases the contact force on the rotor in response to an excessive rotational load, and therefore wear due to friction of the vibration actuator 101, 801, 802, or 803 can be prevented without using complex control.

A so-called WA mode may be provided the image capturing apparatus 400, which enables manual focusing with the focus ring 560 during autofocusing. When the focus ring 560 is operated, the focusing lens 426 is driven by the user rotating the focus ring 560, instead of by the output of the vibration actuator 101, 801, 802, or 803.

The focus ring 560 and the vibration actuator 101, 801, 802, or 803 are connected by a series of gears, and the rotation of the focus ring 560 is transmitted to the vibration actuator 101, 801, 802, or 803 via this series of gears. Therefore, when the focus ring 560 is rotated at a high speed during autofocusing or when the focus ring 560 is rotated while the drive of the vibration actuator 101, 801, 802, or 803 is stopped, torque greater than the reference amount is applied to the rotating axle 240 of the vibration actuator 101, 801, 802, or 803.

In this case, in the vibration actuator 101, 801, 802, or 803, the contact force between the vibrating member 120 and the elastic members 154 and 152 is decreased. As a result, even when torque greater than a reference amount is applied to the rotating axle 240, the friction between the rotating axle 240 and the elastic members 154 and 152 can be decreased, thereby protecting the contact portions of the rotating axle 240 and the elastic members 154 and 152.

Accordingly, the vibration actuator 100, 101, 700, 801, 802, or 803 can be used to generate favorable drive in an optical system, such as an image capturing apparatus or binoculars, or in a focusing mechanism, a zoom mechanism, or blur correcting mechanism, for example. Furthermore, the vibration actuators can be used in precision stages such as an electron beam lithography apparatus, in various detection stages, in a movement mechanism for a cell injector used in biotechnology, or in power sources such as a mobile bed of a nuclear magnetic resonance apparatus, but are not limited to use in these ways.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A vibration actuator comprising:
   a drive unit that generates a drive force;
   a vibrating component that vibrates according to the drive force from the drive unit;
   a rotating body that receives the vibration of the vibrating component to rotate; and
   a converting section that changes a contact force between the vibrating component and the rotating body according to size of a load acting on the rotating body, wherein
   the converting section converts displacement between the rotating body and the vibrating component due to an increase in a rotational load of the rotating body into a change in the contact force,
   the vibrating component includes a vibrating member that is arranged coaxially with the rotating body and that vibrates according to drive from the drive unit,
   the converting section includes (i) a transmission member that rotates upon receiving the vibration of the vibrating member and transmits the rotational movement to the rotating body and (ii) a biasing member that generates a bias force biasing the transmission member toward the vibrating member, and
   the converting section converts displacement between the rotating body and the transmission member due to an increase in the rotational load of the rotating body into a change in the bias force of the biasing member.

2. The vibration actuator according to claim 1, wherein
   the converting section includes an elastic member that serves as both the transmission member and the biasing member by biasing at least one of the rotating body and the vibrating member toward the other in a radial direction and by transmitting the vibrational movement of the vibrating member to the rotating body to rotate the rotating body.

3. The vibration actuator according to claim 2, wherein
   the elastic member rotates together with the rotating body due to the vibrational movement of the vibrating member.

4. The vibration actuator according to claim 2, wherein
   the vibrating member is a cylinder with a circular inner circumference,
   the rotating body has a non-circular portion whose diameter differs depending on a position in a circumferential direction, and
   the elastic member includes a circular portion along the inner circumference of the vibrating member, and a grasping portion that extends from both ends of the circular portion toward the inside of the circular portion to sandwich the non-circular portion of the rotating body.

5. The vibration actuator according to claim 2, wherein
   the elastic member is fixed to the vibrating member and rotates the rotating body.

6. The vibration actuator according to claim 2, wherein
   the other of the rotating body and the vibrating member has a V-shaped groove that contacts the elastic member.

7. The vibration actuator according to claim 6, wherein
   the other of the rotating body and the vibrating member includes an adjusting section that adjusts a position of contact with the elastic member in the radial direction by moving one of a pair of inclined surfaces facing each other in the V-shaped groove closer to or away from the other inclined surface.

8. The vibration actuator according to claim 2, further comprising a pair of holding members that hold the vibrating member near ends thereof in an axial direction of the vibrating member, wherein
   the elastic member is arranged near a center of the vibrating member in the axial direction.

9. The vibration actuator of claim 2, further comprising a holding member that holds the vibrating member near a center of the vibrating member in an axial direction, wherein
   a pair of the elastic members are arranged near ends of the vibrating member in the axial direction.

10. A lens unit comprising:
    an optical component;
    a lens barrel that houses the optical component;
    a manual ring component that is a ring for moving the optical component using manually-applied rotation force; and
    the vibration actuator of claim 1 that is provided inside the lens barrel and that moves the optical component and rotates the manual ring component.

11. An image capturing apparatus comprising:
    an optical component;
    a lens barrel that houses the optical component;
    a manual ring component that is a ring for moving the optical component using manually-applied rotation force;
    the vibration actuator of claim 1 that moves the optical component and rotates the manual ring component;
    an image capturing section that captures an image formed by the optical component; and
    a control section that controls the vibration actuator and the image capturing section.

12. A vibration actuator comprising:
    a drive unit that generates a drive force;
    a vibrating component that vibrates according to the drive force from the drive unit;
    a rotating body that receives the vibration of the vibrating component to rotate; and
    a converting section that changes a contact force between the vibrating component and the rotating body according to size of a load acting on the rotating body, wherein the converting section converts displacement between the rotating body and the vibrating component due to an increase in a rotational load of the rotating body into a change in the contact force, the converting section increases the contact force to a greater degree when displacement between the rotating body and the vibrating component due to an increase in the rotational load of the rotating body is larger, the vibrating component includes a vibrating member that is arranged coaxially with the rotating body and that vibrates according to drive from the drive unit, the converting section includes an elastic member that biases at least one of the rotating body and the vibrating member toward the other in a radial direction and that transmits vibrational movement of the vibrating member to the rotating body to rotate the rotating body, and the elastic member increases a contact force on the vibrating member by generating a larger bias force by being pressed wider when the rotational load of the rotating body is larger.

13. A lens unit comprising:
an optical component;
a lens barrel that houses the optical component;
a manual ring component that is a ring for moving the optical component using manually-applied rotation force; and
the vibration actuator of claim 12 that is provided inside the lens barrel and that moves the optical component and rotates the manual ring component.

14. An image capturing apparatus comprising:
an optical component;
a lens barrel that houses the optical component;
a manual ring component that is a ring for moving the optical component using manually-applied rotation force;
the vibration actuator of claim 12 that moves the optical component and rotates the manual ring component;
an image capturing section that captures an image formed by the optical component; and
a control section that controls the vibration actuator and the image capturing section.

15. A vibration actuator comprising:
a drive unit that generates a drive force;
a vibrating component that vibrates according to the drive force from the drive unit;
a rotating body that receives the vibration of the vibrating component to rotate; and
a converting section that changes a contact force between the vibrating component and the rotating body according to size of a load acting on the rotating body, wherein the converting section converts displacement between the rotating body and the vibrating component due to an increase in a rotational load of the rotating body into a change in the contact force, the converting section increases the contact force to a greater degree when displacement between the rotating body and the vibrating component due to an increase in the rotational load of the rotating body is larger, the vibrating component includes a vibrating member that is a cylinder having a circular inner surface, that is formed coaxially with the rotating body, and that vibrates according to drive of the drive unit, the converting section includes (i) a transmission member that rotates upon receiving the vibration of the vibrating member and transmits the rotational movement to the rotating body and (ii) a biasing member that generates a bias force biasing the transmission member toward the vibrating member, the transmission member has an outer surface that contacts the inner surface, the biasing member biases the rotating body in an axial direction of the rotating body, and the converting section includes:
an inclined surface that is formed on one of the transmission member and the rotating body in a manner to run along a circumferential direction of the rotating body, and that becomes continuously farther away from a surface orthogonal to the rotating body; and
a contact surface that is formed on the other of the transmission member and the rotating body and that contacts the inclined surface.

16. A lens unit comprising:
an optical component;
a lens barrel that houses the optical component;
a manual ring component that is a ring for moving the optical component using manually-applied rotation force; and
the vibration actuator of claim 15 that is provided inside the lens barrel and that moves the optical component and rotates the manual ring component.

17. An image capturing apparatus comprising:
an optical component;
a lens barrel that houses the optical component;
a manual ring component that is a ring for moving the optical component using manually-applied rotation force;
the vibration actuator of claim 15 that moves the optical component and rotates the manual ring component;
an image capturing section that captures an image formed by the optical component; and
a control section that controls the vibration actuator and the image capturing section.

18. A vibration actuator comprising:
a drive unit that generates a drive force;
a vibrating component that vibrates according to the drive force from the drive unit;
a rotating body that receives the vibration of the vibrating component to rotate; and
a converting section that changes a contact force between the vibrating component and the rotating body according to size of a load acting on the rotating body, wherein the converting section converts displacement between the rotating body and the vibrating component due to an increase in a rotational load of the rotating body into a change in the contact force, the converting section decreases the contact force by a greater amount when the displacement between the rotating body and the vibrating component due to an increase in the rotational load of the rotating body is greater, the vibrating component includes a vibrating member that is arranged coaxially with the rotating body and that vibrates according to drive from the drive unit, the converting section includes an elastic member that biases at least one of the rotating body and the vibrating member toward the other in a radial direction and that transmits vibrational movement of the vibrating member to the rotating body to rotate the rotating body, and the elastic member decreases a contact force on the vibrating member by generating a smaller bias force by being contracted when the rotational load of the rotating body is larger.

19. The vibration actuator according to claim 18, wherein
the vibrating member is a cylinder with a circular inner circumference,
the rotating body has a non-circular portion whose diameter differs depending on a position in a circumferential direction,
the elastic member is a torsion spring coiled along the inner circumference of the vibrating member, and includes a pair of grasping portions, one grasping portion at each end thereof, that intersect with each other and that grasp the non-circular portion due to a bias force applied to move the grasping portions toward each other, and
when a rotational load greater than a reference amount is applied, the rotating body moves the grasping portions away from each other, using the non-circular portion, against the bias force.

20. The vibration actuator according to claim 19, wherein the vibrating member includes a V-shaped groove, along the inner circumference thereof, that contacts the elastic member.

21. The vibration actuator according to claim 20, wherein the vibrating member includes an adjusting section that adjusts a position in the radial direction at which an inclined surface contacts the elastic member, by moving one of the pair of inclined surfaces facing each other in the V-shaped groove toward or away from the other.

22. The vibration actuator according to claim 18, wherein
the vibrating member is a cylinder with a circular inner circumference,
the rotating body has a recessed portion that extends in the radial direction formed in an outer surface of an axial end thereof,
the elastic member is a torsion spring coiled along the inner circumference of the vibrating member, and includes a pair of engaging sections that engage with side walls of the recessed portion due to a bias force applied to ends of the engaging sections to move the engaging sections away from each other, and
when the rotational load is greater than a reference amount, the rotating body uses the side walls of the recessed portion to move the pair of engaging sections toward each other against the bias force.

23. The vibration actuator according to claim 22, wherein the vibrating member includes a V-shaped groove, along the inner circumference thereof, that contacts the elastic member.

24. The vibration actuator according to claim 23, wherein the vibrating member includes an adjusting section that adjusts a radial position at which a pair of inclined surfaces, which face each other in the V-shaped groove, contact the elastic member by moving one of the inclined surfaces away from or toward the other.

25. The vibration actuator according to claim 18, further comprising a pair of holding members that hold, in a fixed manner, the vibrating member at ends thereof in an axial direction, wherein
the elastic member is arranged at a center of the vibrating member in the axial direction.

26. The vibration actuator according to claim 18, further comprising a holding member that holds, in a fixed manner, the vibrating member at a center thereof in an axial direction, wherein
a pair of the elastic members are arranged at ends of the vibrating member in the axial direction.

27. A lens unit comprising:
an optical component;
a lens barrel that houses the optical component;
a manual ring component that is a ring for moving the optical component using manually-applied rotation force; and
the vibration actuator of claim 18 that is provided inside the lens barrel and that moves the optical component and rotates the manual ring component.

28. An image capturing apparatus comprising:
an optical component;
a lens barrel that houses the optical component;
a manual ring component that is a ring for moving the optical component using manually-applied rotation force;
the vibration actuator of claim 18 that moves the optical component and rotates the manual ring component;
an image capturing section that captures an image formed by the optical component; and
a control section that controls the vibration actuator and the image capturing section.

* * * * *